(12) United States Patent
Bharadwaj et al.

(10) Patent No.: US 12,364,060 B2
(45) Date of Patent: Jul. 15, 2025

(54) BOTTOM TUNNEL JUNCTION LIGHT-EMITTING FIELD-EFFECT TRANSISTORS

(71) Applicant: Cornell University, Ithaca, NY (US)

(72) Inventors: Shyam Bharadwaj, Ithaca, NY (US); Kevin Lee, Ithaca, NY (US); Kazuki Nomoto, Ithaca, NY (US); Austin Hickman, Hickman, NY (US); Len van Deurzen, Ithaca, NY (US); Huili Grace Xing, Ithaca, NY (US); Debdeep Jena, Ithaca, NY (US); Vladimir Protasenko, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 18/096,889

(22) PCT Filed: Jul. 13, 2021

(86) PCT No.: PCT/US2021/070870
§ 371 (c)(1),
(2) Date: Jan. 13, 2023

(87) PCT Pub. No.: WO2022/016183
PCT Pub. Date: Jan. 20, 2022

(65) Prior Publication Data
US 2025/0194294 A1    Jun. 12, 2025

Related U.S. Application Data

(60) Provisional application No. 63/052,180, filed on Jul. 15, 2020.

(51) Int. Cl.
*H10H 20/825*    (2025.01)
*H10H 20/00*    (2025.01)
(Continued)

(52) U.S. Cl.
CPC ...... *H10H 20/062* (2025.01); *H10H 20/0137* (2025.01); *H10H 20/032* (2025.01);
(Continued)

(58) Field of Classification Search
CPC .............................. H01L 33/32; H10H 20/825
(Continued)

(56) References Cited

U.S. PATENT DOCUMENTS 6,847,057 B1    1/2005   Gardner
7,589,346 B2    9/2009   Biwa et al.
(Continued)

FOREIGN PATENT DOCUMENTS

DE    202006003360 U1    6/2006
WO    WO2019152611 A1    8/2019

OTHER PUBLICATIONS

Pengfei Tian et al., Fabrication, characterization and applications of flexible vertical InGaN micro-light emitting diode arrays, Optics Express, vol. 24, No. 1 (Jan. 11, 2016), pp. 699-707.
(Continued)

*Primary Examiner* — Hsin Yi Hsieh
(74) *Attorney, Agent, or Firm* — Culhane Meadows PLLC; Orlando Lopez

(57) ABSTRACT

A method for achieving voltage-controlled gate-modulated light emission using monolithic integration of fin- and nanowire- n-i-n vertical FETs with bottom-tunnel junction planar InGaN LEDs is described. This method takes advantage of the improved performance of bottom-tunnel junction LEDs over their top-tunnel junction counterparts, while allowing for strong gate control on a low-cross-sectional area fin or wire without sacrificing LED active area as in lateral integration designs. Electrical modulation of 5 orders, and an order of magnitude of optical modulation are achieved in the device.

19 Claims, 20 Drawing Sheets

(51) Int. Cl.
   H10H 20/01    (2025.01)
   H10H 20/812   (2025.01)
   H10H 20/821   (2025.01)
   H10H 20/831   (2025.01)
(52) U.S. Cl.
   CPC ........ *H10H 20/812* (2025.01); *H10H 20/821* (2025.01); *H10H 20/825* (2025.01); *H10H 20/8312* (2025.01)
(58) Field of Classification Search
   USPC .......................................................... 257/9
   See application file for complete search history.

(56) References Cited

U.S. PATENT DOCUMENTS

| | | | |
|---|---|---|---|
| 7,671,375 | B2 | 3/2010 | Otsuka et al. |
| 7,737,451 | B2 | 6/2010 | Ibbetson |
| 7,897,976 | B2 | 3/2011 | Kawazoe et al. |
| 8,426,224 | B2 | 4/2013 | Wang et al. |
| 8,809,987 | B2 | 8/2014 | Chen |
| 8,932,940 | B2 | 1/2015 | Wang et al. |
| 9,799,520 | B2 | 10/2017 | Roberts |
| 10,490,696 | B2 | 11/2019 | David et al. |
| 11,011,571 | B2 | 5/2021 | Hartensveld et al. |
| 11,038,023 | B2 | 6/2021 | Boles et al. |
| 2007/0278478 | A1 | 12/2007 | Zaumseil et al. |
| 2018/0204977 | A1 | 7/2018 | Dheeraj |
| 2019/0081206 | A1 | 3/2019 | Banna et al. |
| 2020/0119085 | A1 | 4/2020 | Chen |
| 2021/0043795 | A1* | 2/2021 | Turski ................... H01S 5/3095 |

OTHER PUBLICATIONS

Ludovic Dupré, Marjorie Marra, Valentin Verney, Bernard Aventurier, Franck Henry, François Olivier, Sauveur Tirano, Anis Daami, François Templier, "Processing and characterization of high resolution GaN/InGaN LED arrays at 10 micron pitch for micro display applications," Proc. SPIE 10104, Gallium Nitride Materials and Devices XII, 1010422 (Feb. 16, 2017).
Kai-Jun Pai, Temperature Rise Effects on Dynamic Resistances for Laser Diodes With a Wavelength of 450 nm for Vehicle Headlight Applications, IEEE Transactions On Vehicular Technology, vol. 68, No. 10, Oct. 2019, pp. 9529-9542.
Munisamy Anandan, Progress of LED backlights for LCDs, Journal of the SID 16/2, 2008, pp. 287-310.
Steven P. DenBaars et al., Development of gallium-nitride-based light-emitting diodes (LEDs) and laser diodes for energy-efficient lighting and displays, Acta Materialia 61 (2013) 945-951.
Shuji Nakamura, Takashi Mukai, Masayuki Senoh, Candela-class high-brightness InGaN/AlGaN double- heterostructure blue-light-emitting diodes, Appl. Phys. Lett. 64, 1687-1689 (1994).
Kristin A. Denault, Michael Cantore, Shuji Nakamura, Steven P. DenBaars, Ram Seshadri, Efficient and stable laser- driven white lighting, AIP Advances 3, 072107 (2013).
Honglei Li, Xiongbin Chen, Junqing Guo, and Hongda Chen, A 550 Mbit/s real-time visible light communication system based on phosphorescent white light LED for practical high-speed low-complexity application, Optics Express, vol. 22, No. 22 (Nov. 3, 2014).
Chia-Lung Tsai and Zhong-Fan Xu, Line-of-Sight Visible Light Communications With InGaN-Based Resonant Cavity Leds, IEEE Photonics Technology Letters, vol. 25, No. 18, Sep. 15, 2013, pp. 1793-1796.
Harald Haas, LiFi is a paradigm-shifting 5G technology, Reviews in Physics 3 (2018) 26-31.
M. Feng, N. Holonyak, Jr., G. Walter, R. Chan, Room temperature continuous wave operation of a heterojunction bipolar transistor laser, Appl. Phys. Lett. 87, 131103 (2005).

Yueh-Ru Yang, Brightness Control of LED Lamps Using Fuzzy Logic Controllers, 2010 5th IEEE Conference on Industrial Electronics and Applications.
J. Garcia, D. G. Lamar, M.A. Dalla-Costa, J.M. Alonso, M. Rico-Secades, An Estimator of Luminous Flux for Enhanced Control of High Brightness LEDs, 2008 IEEE Power Electronics Specialists Conference.
Andrei Ion Bogdan, Nicu Bizon, Voltage-mode control of the DC-DC power converter—a short review, ECAI 2015 (Electronics, Computers and Artificial Intelligence).
Yuefei Cai, Xinbo Zou, Chao Liu, and Kei May Lau, Voltage-Controlled GaN HEMT-LED Devices as Fast-Switching and Dimmable Light Emitters, IEEE Electron Device Letters, vol. 39, No. 2, Feb. 2018.
Matthew Hartensveld, and Jing Zhang, Monolithic Integration of GaN Nanowire Light-Emitting Diode With Field Effect Transistor, IEEE Electron Device Letters, vol. 40, No. 3, Mar. 2019.
Z. Li, J. Waldron, T. Detchprohm, C. Wetzel, R. F. Karlicek, Jr., T. P. Chow, Monolithic integration of light-emitting diodes and power metal-oxide-semiconductor channel high-electron-mobility transistors for light-emitting power Integrated circuits in GaN on sapphire substrate, Appl. Phys. Lett. 102, 192107 (2013).
Jiabin Yan, Jinlong Piao, and Yongjin Wang, An Enhancement Mode MOSFET Based on GaN-on-Silicon Platform for Monolithic Oeic, IEEE Electron Device Letters, vol. 41, No. 1, Jan. 2020.
Chao Liu, Yuefei Cai, Zhaojun Liu, Jun Ma, Kei May Lau, Metal-interconnection-free integration of InGaN/GaN light emitting diodes with AlGaN/GaN high electron mobility transistors, Appl. Phys. Lett. 106, 181110 (2015).
Zhibo Guo, Collin Hitchcock, Christian Wetzel, Robert F. Karlicek, Jr., Guanxi Piao, Yoshiki Yano, Shuuichi Koseki, Toshiya Tabuchi, Koh Matsumoto, Mayank Bulsara, and T. Paul Chow, Monolithically Integrated GaN ED/Quasi-Vertical Power U-Shaped Trench-Gate MOSFET Pairs Using Selective Epi Removal, IEEE Electron Device Letters, vol. 40, No. 11, Nov. 2019.
Chao Liu, Yuefei Cai, Xinbo Zou, and Kei May Lau, Low-Leakage High-Breakdown Laterally Integrated HEMT-LED via h-GaN Electrode, IEEE Photonics Technology Letters, vol. 28, No. 10, May 15, 2016.
Chih-Yao Chang, Yi-Chen Li, Kailin Ren, Yung C. Liang, and Chih-Fang Huang, An AlGaN/GaN High Electron Mobility Transistor With a Built-In Light Emitter Using Radiative Recombination of Two-Dimensional Electron Gas and Holes, Journal of the Electron Devices Society, vol. 8, 2020, pp. 346-349.
Zhibo Guo et al., Integrable Quasivertical GaN U-Shaped Trench-Gate Metal-Oxide-Semiconductor Field-Effect Transistors for Power and Optoelectronic Integrated Circuits, Phys. Status Solidi A 2020, 217, 1900615.
Henryk Turski, Shyam Bharadwaj, Huili (Grace) Xing, and Debdeep Jena, Polarization control in nitride quantum well ight emitters enabled by bottom tunnel-junctions, J. Appl. Phys. 125, 203104 (2019).
Shyam Bharadwaj, Jeffrey Miller, Kevin Lee, Joshua Lederman, Marcin Siekacz, Huili (Grace)King, Debdeep Jena, Czesław Skierbiszewski, and Henryk Turski, Enhanced injection efficiency and light output in bottom tunnel-junction light-emitting diodes, Optics Express, vol. 28, No. 4 / Feb. 17, 2020.
Zongyang Hu, Wenshen Li, Kazuki Nomoto, Mingda Zhu, Xiang Gao, Manyam Pilla Debdeep Jena and Huili Grace Xing, GaN Vertical Nanowire and Fin Power MISFETs, 2017 75th Annual Device Research Conference (DRC).
Zongyang Hu, Kazuki Nomoto, Wenshen Li, Zexuan Zhang, Nicholas Tanen, Quang Tu Thieu, Kohei Sasaki, Akito Kuramata, Tohru Nakamura, Debdeep Jena, Huili Grace Xing, Breakdown mechanism in 1 kA/cm2 and 960 V E-mode β-Ga2O3 vertical transistors, Appl. Phys. Lett. 113, 122103 (2018).
W. Li, K. Nomoto, Z. Hu, T. Nakamura, D. Jena and H. G. Xing, Single and multi-fin normally-off Ga2O3 vertical transistors with a breakdown voltage over 2.6 kV, 2019 IEEE International Electron Devices Meeting (IEDM).
Bharadwaj et al., Enhanced injection efficiency and light output in bottom tunnel-junction light-emitting diodes, Optics Express, vol. 28, No. 4, Feb. 17, 2020.

(56) References Cited

OTHER PUBLICATIONS

Turski et al., Polarization control in nitride quantum well light emitters enabled by bottom tunnel-junctions, Journal of Applied Physics, vol. 125, No. 203104, May 30, 2019.
Bharadwaj et al., Bottom tunnel junction blue light-emitting field-effect transistors, Applied Physics Letters, vol. 117, No. 031107, Jul. 24, 2020.
PCT/US2021/070870 International Search Report Nov. 5, 2021.
Sriram Krishnamoorth et al., GdN Nanoisland-Based GaN Tunnel Junctions, Nano Letters 13(6) (May 2013).
Seong-Ran Jeon et al., GaN-Based Light-Emitting Diodes Using Tunnel Junctions, IEEE Journal of Selected Topics in Quantum Electronics, vol. 8, No. 4, Jul./Aug. 2002.
Mitsuru Kaga et al., GaInN-Based Tunnel Junctions in n-p-n Light Emitting Diodes, Japanese Journal of Applied Physics 52 (2013).
Hiroshi Okada et al., Light emitting FET based-on spatially selective doping of Eu in AlGaN/GaN HEMT, Phys. Status Solidi A, No. 6 (2009).

\* cited by examiner

BOTTOM TUNNEL JUNCTION LIGHT-EMITTING FIELD-EFFECT TRANSISTORS

CROSS-REFERENCE TO RELATED APPLICATIONS

This application is a U.S. national stage application under 35 U.S.C. 371 of co-pending International Application No. PCT/US2021/070870 filed on Jul. 13, 2021 and entitled BOTTOM TUNNEL JUNCTION LIGHT-EMITTING FIELD-EFFECT TRANSISTORS, which in turn claims the benefit of priority to U.S. Provisional Patent Application No. 63/052,180, filed on Jul. 15, 2020, and entitled "BOTTOM TUNNEL JUNCTION LIGHT-EMITTING FIELD-EFFECT TRANSISTORS," both of which are incorporated herein by reference in their entirety and for all purposes.

STATEMENT REGARDING FEDERALLY SPONSORED RESEARCH OR DEVELOPMENT

This invention was made [partially] with U.S. Government support from the National Science Foundation under Awards No. 1534303, 1710298, 1719875, 1839196 and from NSF National Nanotechnology Coordinated Infrastructure under Awards No. ECCS-1542081, DMR-1719875, MRI DMR-1338010. The U.S. Government has certain rights to the invention.

BACKGROUND

Visible light-emitting diodes (LEDs) based on the Indium Gallium Nitride (InGaN) material system have emerged as fundamental components in micro-LED display technology, car headlamps, and cell phone backlighting, amongst other lighting applications. More recently, interest in InGaN LEDs has spread beyond lighting applications towards a different area—light fidelity (Li-Fi) communications—due to promises of faster and more secure data transmission compared to conventional Wi-Fi. InGaN LEDs are attractive for such applications due to their preponderance in lighting, and also due to their high external quantum efficiencies (EQEs) in the visible spectral range—a range which is >2000× larger in bandwidth than the entire RF spectral range, and one which is currently underutilized.

In order to use LEDs for Li-Fi communications, high speed modulation of the LED light output is desirable. This modulation is achieved with the use of a current or voltage driver.

In the GaAs semiconductor family, heterojunction bipolar transistors (HBTs) have been redesigned epitaxially into LEDs and even laser diodes (LDs) for current driven operation. Though the Nitride semiconductor family allows for visible to UV emission wavelengths and higher power operation, to realize HBT-LEDs or HBT-LDs similar to GaAs requires the quantum well active region to be placed inside p-type base-layers, which are rather resistive and problematic for contact formation. Voltage-driven control methods involve simpler control schemes and offer more flexibility than current-driven methods. Using GaN FETs directly integrated on the LED for voltage driving can take advantage of a single epitaxial step, and the excellent performance demonstrated by vertical GaN FETs. Towards this end, integration of GaN-based FETs and LEDs on the same epi-wafer can enable high power and high efficiency voltage-controlled modulated visible light emission while eliminating interconnects and reducing the overall device footprint. Prior demonstrations integrating III-Nitride FETs and LED structures on the same epi-wafer for these applications involve lateral integration of High Electron Mobility Transistors (HEMTs) with the LED, or vertical integration through a top-down full nanowire platform. However, both strategies limit the LED active area on the wafer: the former strategy requires removing the LED epi from certain regions of the wafer (and in certain processes, an additional regrowth step to define the LED structure). The latter constrains LED active volume down to the size of a gate-controllable nanowire, severely limiting the optical output power.

BRIEF SUMMARY

The strategy demonstrated in these teachings offers a solution to both problems by integrating nanowire and fin vertical n-FETs on large-area planar LEDs through top-down fabrication on a heterostructure that is realized in one epitaxial stack. This approach allows for strong all-around gate control on the relatively low cross sectional area FETs, while allowing large area LEDs that take advantage of the on-wafer area for high output power.

For a better understanding of the present teachings, together with other and further needs thereof, reference is made to the accompanying drawings and detailed description.

DETAILED DESCRIPTION

The following detailed description presents the currently contemplated modes of carrying out the invention. The description is not to be taken in a limiting sense but is made merely for the purpose of illustrating the general principles of the invention.

Group III, as used herein, refers to CAS Group IIIA (Triels or the Boron group) in the periodic table.

Group V, as used herein, refers to the Nitrogen group.

III-nitride semiconductor materials, as used herein, refers to (Al, In, Ga and their alloys) N.

A "tunnel junction," as used herein, refers to one or more highly doped n-type layers followed by one or more highly doped p-type layers.

The strategy demonstrated in these teachings offers a solution to both problems by integrating nanowire and fin vertical n-FETs on large-area planar LEDs through top-down fabrication on a heterostructure that is realized in one epitaxial stack. This approach allows for strong all-around gate control on the relatively low cross-sectional area FETs, while allowing large area LEDs that take advantage of the on-wafer area for high output power.

In order to vertically integrate nanowire- or fin-n-FETs with planar LEDs, the wires or fins must sit on top of the planar LED. This requires the top layer of the LED to be n-GaN rather than β-GaN. A tunnel junction (TJ) LED is required if conventional n-GaN substrates are used. This particular embodiment uses bottom-TJ homojunction LEDs, which have been shown to outperform standard top-TJ LEDs in terms of wall-plug efficiency with n-i-n vertical n-FETs on top, (see, International Publication No, WO2019/152611A1, entitled PLATFORMS ENABLED BY BURIED TUNNEL JUNCTION FOR INTEGRATED PHOTONIC AND ELECTRONIC SYSTEMS, published on Aug. 8, 2019, Shyam Bharadwaj et al., Enhanced injection efficiency and light output in bottom tunnel-junction light-emitting diodes, Opt. Express, Vol. 28, No. 4, Feb. 17, 2020, Henryk Turski et al., Polarization control in nitride quantum well light emitters enabled by bottom tunnel-junctions, J. Appl. Phys. 125, 203104 (2019), all of which are incorporated by reference herein in their entirety and for all purposes) as shown in FIGS. 1A-1C and 1E, with a circuit level schematic of the LEFET devices shown in FIG. 1D.

Figure 1A:
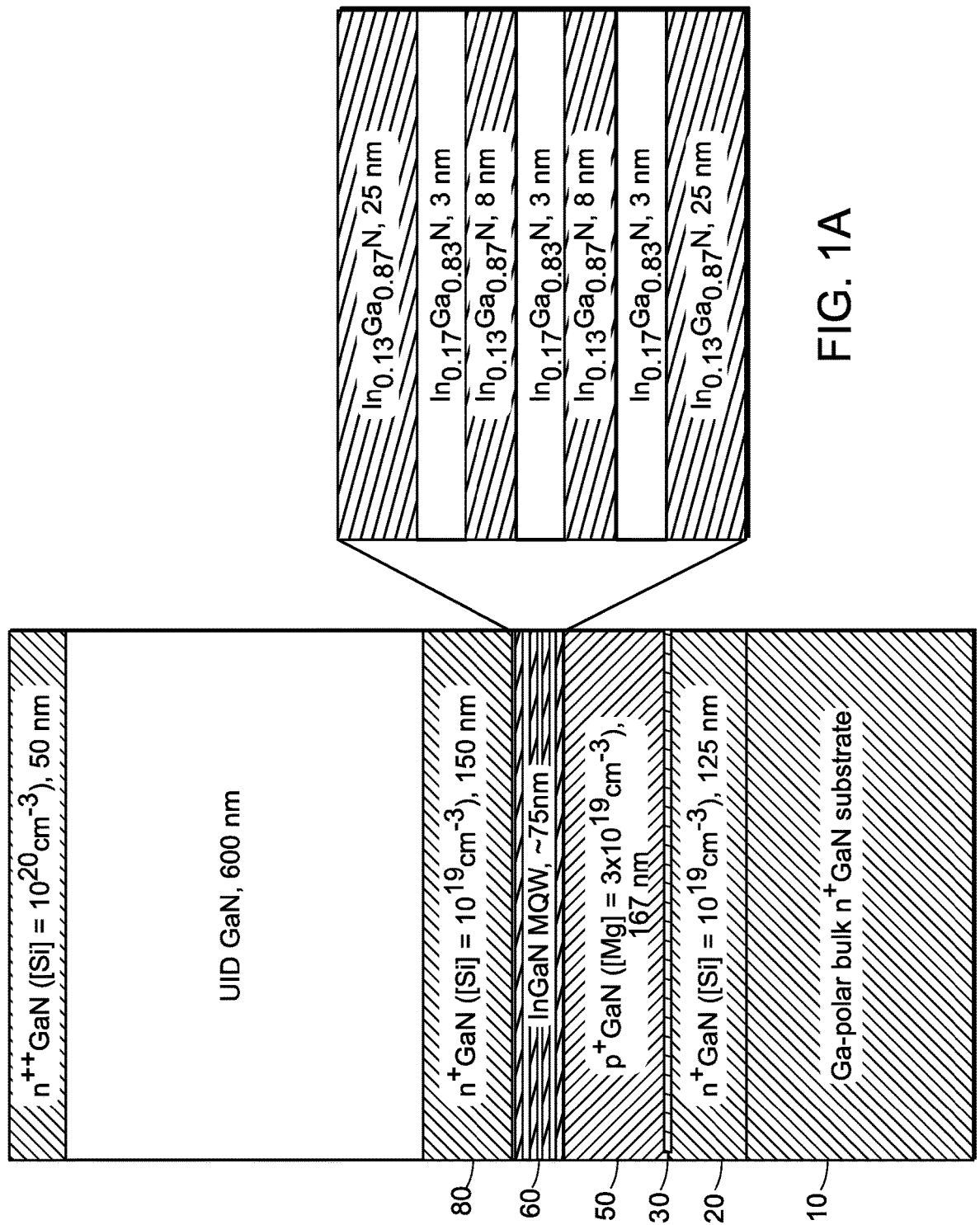
FIG. 1A shows epitaxial layer structure for the one embodiment of the structure of these teachings.

FIG. 1A shows epitaxial layer structure for the one embodiment of the structure of these teachings. The structure shown in FIG. 1A is a Light-Emitting FET (LEFET). The structure in FIG. 1A includes a vertical n-i-n GaN FET sitting above a bottom-TJ homojunction InGaN LED. Referring to FIG. 1A, in the embodiment shown therein, the structure has a substrate 10, the substrate and having a first surface opposite a second surface. Possible substrates include a substrate that is compatible with GaN growth, such as, but not limited to, bulk n-GaN, bulk UID GaN, SI-GaN on Sapphire, Sapphire, SiC. One or more layers of n doped III-nitride material 20 are disposed on the first surface of the substrate 10. A tunnel junction 30 is disposed on the one or more layers of n doped III-nitride material 20. One or more p-type III-nitride layers 50 is formed directly on the tunnel junction. An active layer 60 including one or more III-nitride quantum wells is disposed on the one or more p-type III-nitride layers 50. One or more other layers of n-doped III-nitride material 80 are disposed on the active layer 60. A layer of unintentionally doped III-nitride material 90 is disposed on the one or more other layers of n-doped III-nitride material 80. The one or more layers of unintentionally doped III-nitride material 90 are patterned into nanopillars or nanowires. A further layer of n-doped III-nitride material 110 is disposed on the nanopillars or nanowires 90. The Light-Emitting FET (LEFET) structure includes a vertical n-i-n GaN FET sitting above a bottom-TJ homojunction InGaN LED.

In the embodiment shown in FIG. 1A, the substrate 10 is Ga-four bulk n doped GaN material. The one or more layers of n doped III-nitride material 20 are n doped GaN material. One embodiment of the tunnel junction 30 is shown in FIG. 1E. The one or more p-type III-nitride layers 50 are p doped GaN material. The active layer 60 includes a number of layers of $In_{0.13}Ga_{0.87}N$ material separated by layers of $In_{0.17}Ga_{0.83}N$ material. The one or more other layers of n-doped III-nitride material 80 are one or more layers of n doped GaN material. The one or more layers of unintentionally doped III-nitride material are unintentionally doped GaN material. The further layer of n-doped III-nitride material 110 is n doped GaN material. It should be noted that these teachings are not limited only to this embodiment.

Figure 1B:
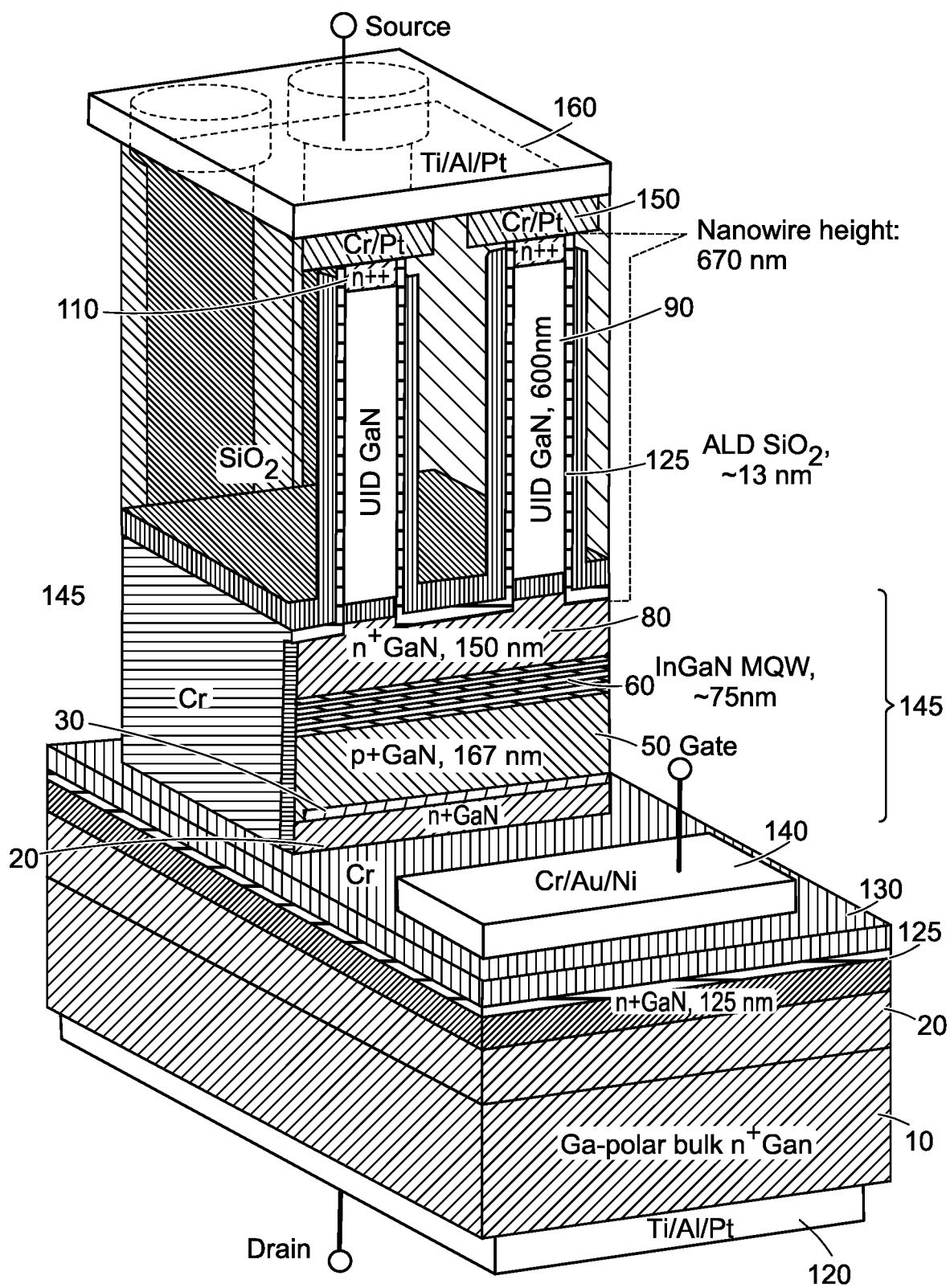
FIG. 1B shows a schematic of one fabricated embodiment of a nanowire LEFET structure of these teachings.

FIG. 1B shows a schematic of one fabricated embodiment of a nanowire LEFET structure of these teachings. Referring to FIG. 1B, in the embodiment shown therein, the light-emitting FET structure includes a substrate 10 having a first surface opposite a second surface. One or more layers of n doped III-nitride material 20 are disposed on the first surface of the substrate 10. A sub-structure 145 is formed on a portion of the one or more layers of n doped III-nitride material 20. The sub-structure 145 includes a tunnel junction 30 disposed on a portion of the one or more layers of n doped III-nitride material 20. The sub-structure 145 also includes a p-type III-nitride layer 50 formed directly on the tunnel junction 30, an active layer 60 comprising one or more III-nitride quantum wells disposed on the p-type III-nitride layer 50, and one or more other layers of n-doped III-nitride material 80 disposed on the active layer 60. A layer of unintentionally doped III-nitride material 90 is disposed on the one or more other layers of n-doped III-nitride material 80 of the sub-structure. The layer of unintentionally doped III-nitride material 90 is patterned into one or more nanopillars or nanowires. A further layer of n-doped III-nitride material 110 is disposed on the one or more nanopillars or nanowires 90 The device also includes another portion of the one or more layers of n-doped III-nitride material 20. An insulating layer 125 is disposed on surfaces of the nanopillars or nanowires 90 extending from below the further layer of n-doped III-nitride material 110 to the one or more other layers of n-doped III-nitride material 80 not covered by the layer of unintentionally doped III-nitride material 90, which is formed into the one or more nano pillars or nano wires. The insulating layer 125 is also disposed in the embodiment shown in along the sub-structure 145 from the one or more other layers 80 of n-doped III-nitride material to the portion of the one or more layers of n doped III-nitride material 20. The insulating layer 125 also is disposed along the portion of the one or more layers of n doped III-nitride material 20 to the other portion of the one or more layers of n doped III-nitride material 20 and the insulating layer 125 is also disposed on the other portion of the one or more layers of n doped III-nitride material 20. A metal layer 130 is disposed over the insulating layer 125. A first ohmic contact layer 140 is disposed on a portion of the metal layer 130. A second ohmic contact layer 150 is disposed on the further layer of n-doped III-nitride material 110. In the embodiment shown in FIG. 1B, there is a further ohmic contact layer 160 disposed on the second ohmic contact layer 150. A third ohmic contact 120 is disposed on the second surface of the substrate 10 when the substrate 10 is conductive. When the substrate 10 is non-conductive, the third ohmic contact 120 is disposed on the one or more layers of n doped III-nitride material 20. The first 140, second 150 and third 120 ohmic contact layers provide the drain, gate, source contacts for biasing the device, and the insulating layer (dielectrics) provides the isolation for the gate contact.

Referring to FIG. 1B, in the embodiment shown therein, the substrate is GA polar bulk n-doped GaN and the one or more layers of n doped III-nitride material 20 are n-doped GaN. The p-type III-nitride layer 50 is a p-doped GaN layer. The active layer 60 has a number of layers of InGaN quantum wells. The one or more other layers of n-doped III-nitride material 80 are one or more n-doped GaN layers. The layer of unintentionally doped III-nitride material 90 is unintentionally doped GaN. The further layer of n-doped III-nitride material 110 is n-doped Gan. The insulating layer 125 is atomic layer deposited (ALD) $SiO_2$ material. The third ohmic contact is Ti/Al/Pt. The metal layer 130 is a Cr layer. The second ohmic contact 150 is Cr/Pt. There is another ohmic contact layer 160 deposited on the second ohmic contact 150 and that layer is Ti/Al/Pt. The first ohmic contact 140 is Cr/Au/Ni. It should be noted that these teachings are not limited only to this embodiment.

Figure 1C:
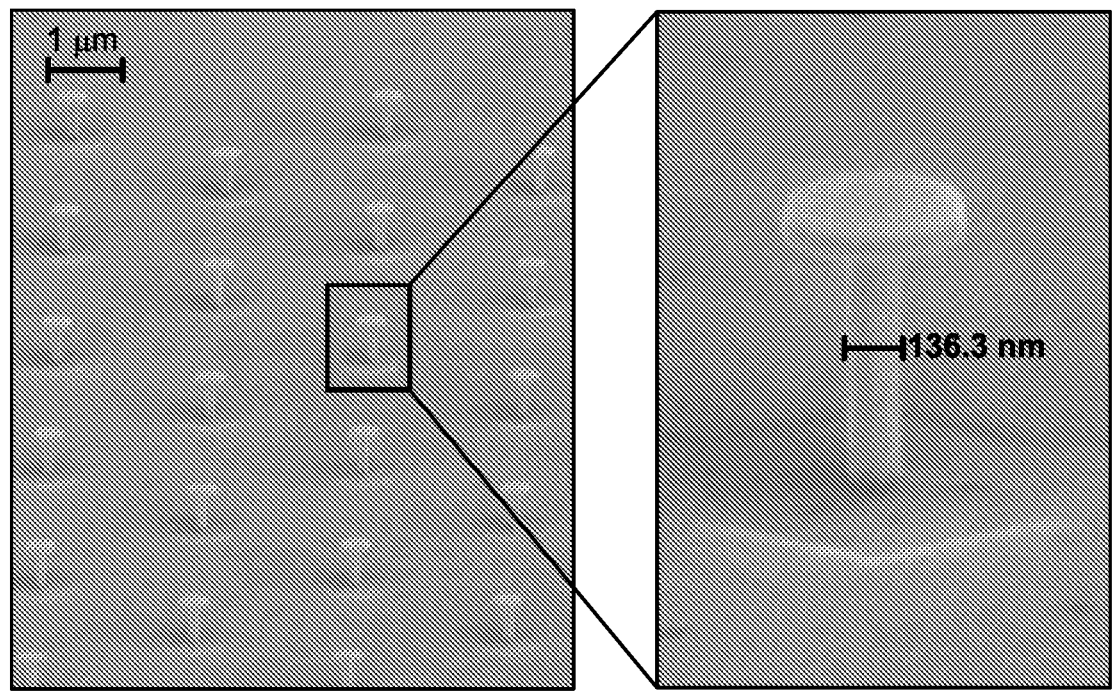
FIG. 1C shows an SEM image of one embodiment of the structure of these teachings showing sub-micron nanowires with vertical sidewalls after wet etching, before removing the etch mask.
Figure 1D:
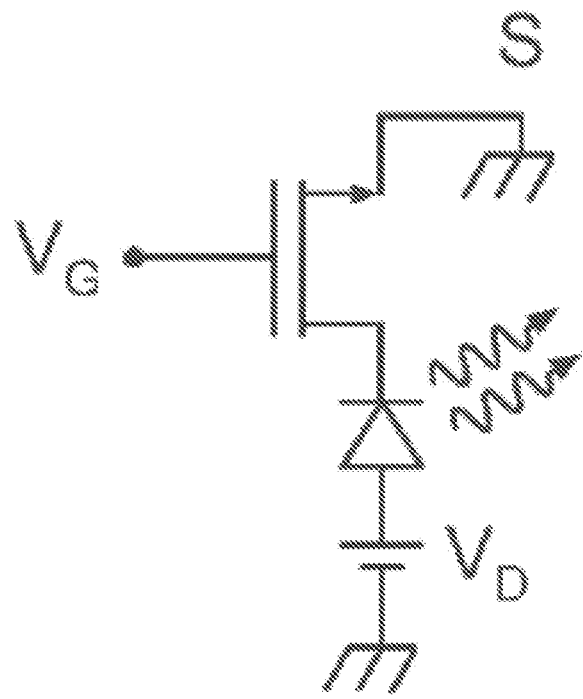
FIG. 1D shows a circuit level schematic of one embodiment of the LEFET structure of these teachings.
Figure 1E:
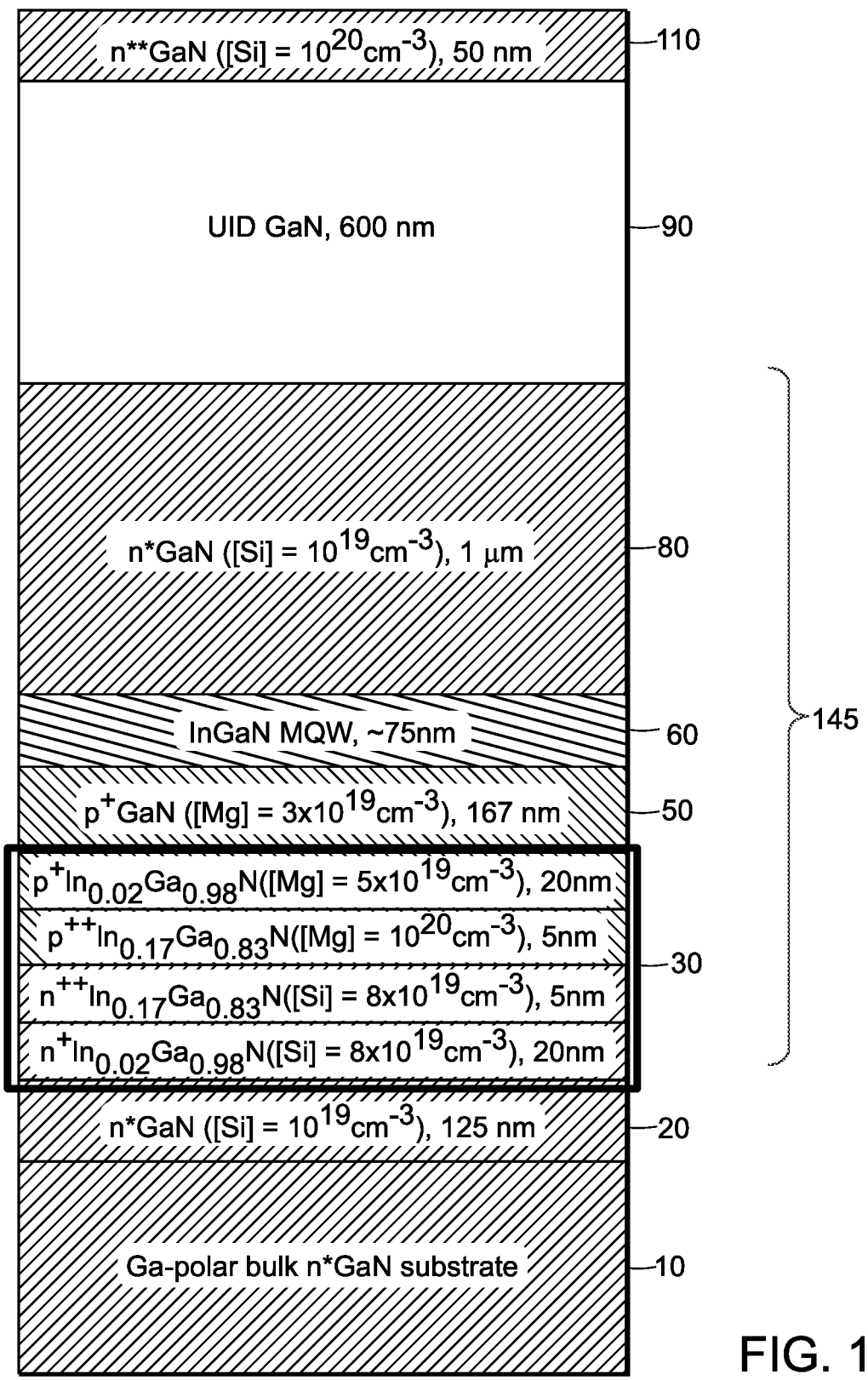
FIG. 1E shows another embodiment of the Epitaxial layer structure, as in FIG. 1A, with the Tunnel junction being shown in detail.

FIG. 1C shows an SEM image of one embodiment of the structure of these teachings showing sub-micron nanowires with vertical sidewalls after wet etching, before removing the etch mask. FIG. 1D shows a circuit level schematic of one embodiment of the LEFET structure of these teachings.

FIG. 1E shows another embodiment of the Epitaxial layer structure, as in FIG. 1A, with the Tunnel junction 30 being shown in detail. In the embodiment shown there in, the tunnel junction 30 includes two subsequent thin layers of higher doped n-type III nitride material followed by two subsequent thin layers of higher doped p-type III-nitride material. In the embodiment shown in FIG. 1E, a higher doped n-type $In_{0.02}Ga_{0.98}N$ material layer is followed by a highly doped n-type type $In_{0.17}Ga_{0.83}N$ material layer, and on the other side of the tunnel junction, a higher doped p-type $In_{0.17}Ga_{0.83}N$ material layer is followed by a higher doped p-type $In_{0.02}Ga_{0.98}N$ material layer. It should be noted that these teachings are not limited only to this embodiment.

Figure 1F:
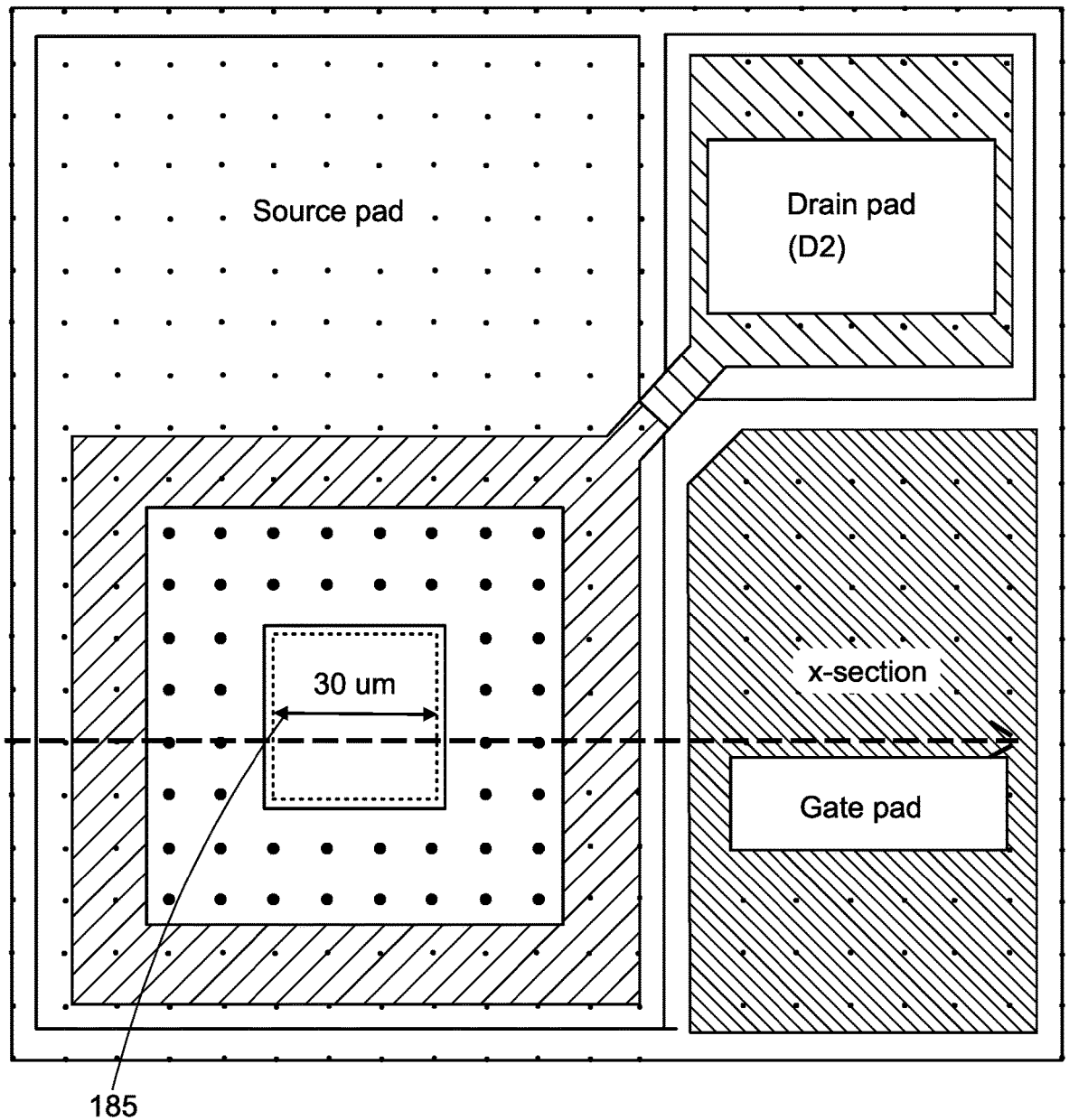
FIG. 1F shows a top view of a further fabricated embodiment of a nanowire LEFET structure of these teachings.
Figure 1G:
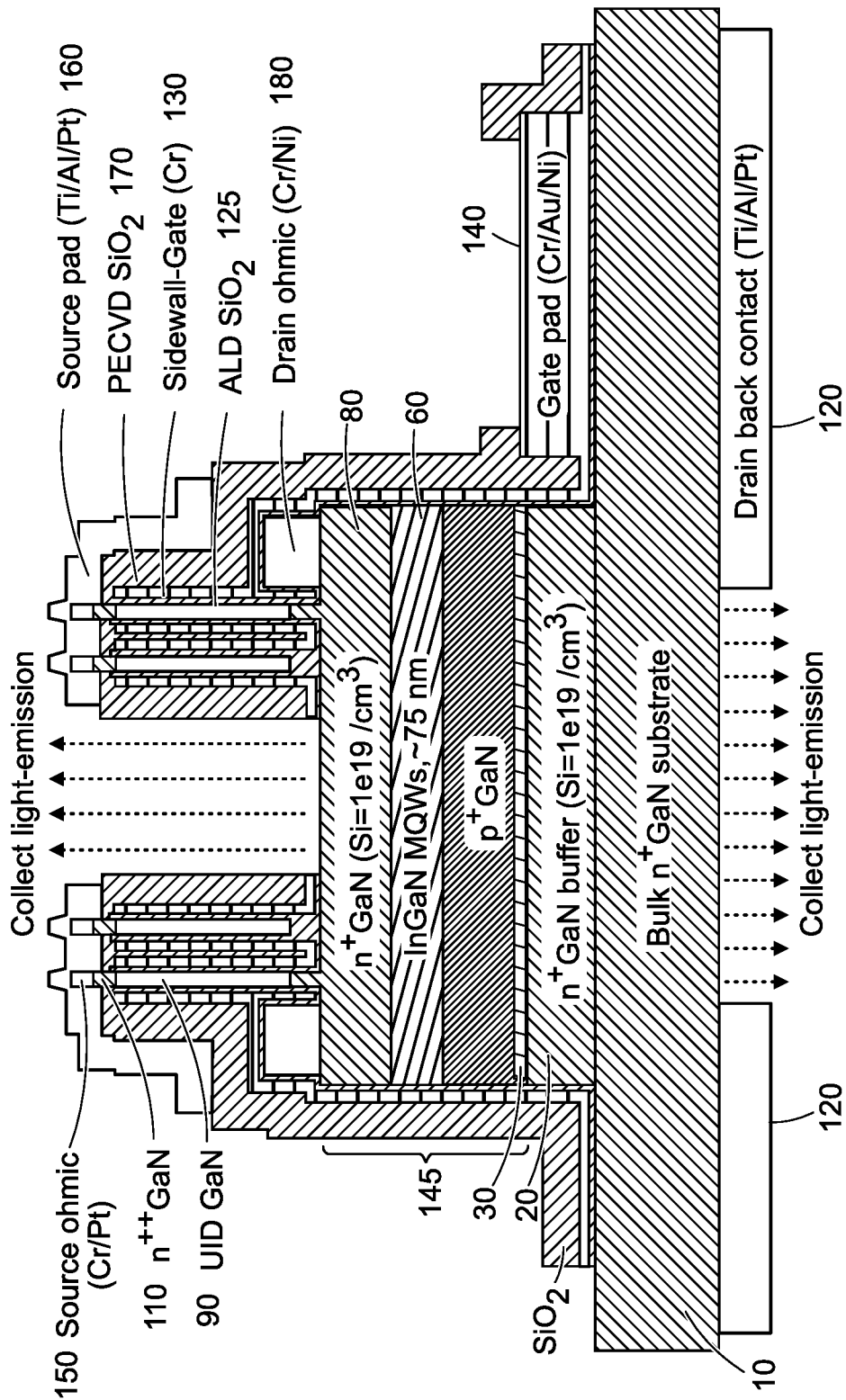
FIG. 1G shows a cross-sectional view of that further fabricated embodiment.
Figure 1H:
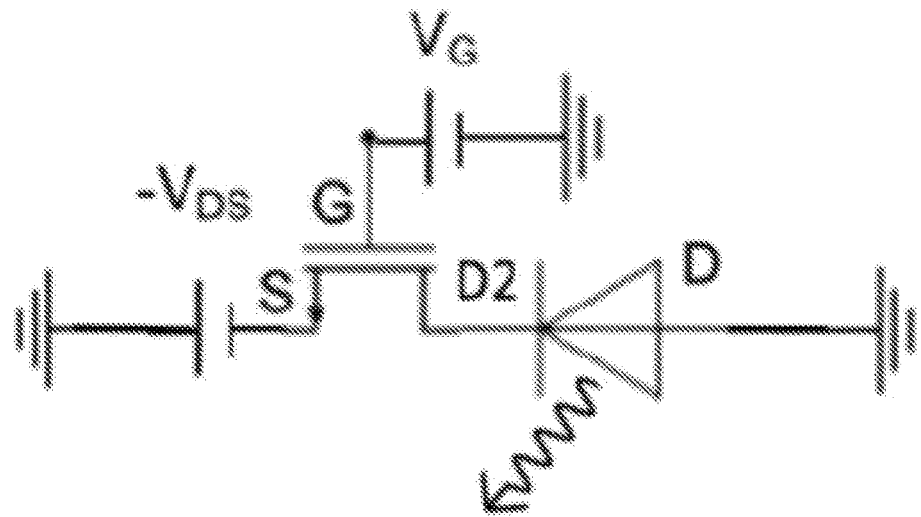
FIG. 1H shows a circuit level schematic of that further fabricated embodiment.

FIGS. 1F and 1G show a top view and cross-section of another fabricated embodiment of an LEFET structure of these teachings. In FIG. 1G, elements or components that have a same function as elements or components shown in FIGS. 1A and 1B are given the same element number. The embodiment shown in FIG. 1G as an additional ohmic contact. The additional ohmic contact 180 is disposed on an outer area of the one or more other layers of n-doped III-nitride material 80 of the sub-structure 145. The additional ohmic contact 180 is depicted as D2 in the schematic of the structure shown in FIG. 1H, where the first ohmic contact 140 is depicted as G and the second ohmic contact 160 is depicted as S. The third ohmic contact 120 is depicted as D. As shown by the schematic in FIG. 1H, The S-G-D2 n-i-n FETs can be utilized separately from the LED, whilst floating D. In another configuration, the S-G-D n-p-i-n-i-n LEFET can be used with floating D2. Another possibility enabled by the four-contact geometry of the embodiment shown in FIG. 1G is the ability to use the LED separately from the FETs by forward biasing D2 with respect to D.

In some embodiments, the one or more nanopillars or nanowires ae at least two one or more nanopillars or nanowires. The two or more nanopillars or nanowires include two groups of nanopillars or nanowires. In one instance, each one of the groups of nanopillars or nanowires surrounds a portion of a perimeter of an opening 185. The opening avoids reflection and absorption of the light generated by the LED quantum wells. The large electron conductivity of the n+GaN 20 allows the current to spread laterally and allows for uniform emission. In another instance, the third ohmic contact 120 has another opening, an area of the other opening, in the third ohmic contact 120, substantially includes an area of the opening 185. The opening in the third ohmic contact 120 allows better collection of light from the backside of the device.

The diameter of the nanowire or width of the fin FET90 range from about 400 nm to about 2 μm to allow for significant modulation of the drain-source current by field-effect whilst simultaneously allowing large electron current for high output power from the LED.

The deposition of one embodiment of the device of these teachings is described hereinbelow. It should be noted that these teachings are not limited only to this embodiment.

The light-emitting FET (LEFET) structure was grown by plasma-assisted molecular beam epitaxy (PAMBE) in a single growth on a free standing Lumilog bulk n-type GaN substrate with a dislocation density of $10^7$ $cm^{-2}$. The growth was performed using a Nitrogen RF plasma power of 400 W, corresponding to a growth rate of 420 nm/hr. During growth, reflection high-energy electron diffraction (RHEED) was used to confirm a metal-rich growth condition, which promotes 2D growth in PAMBE.

One embodiment of the epitaxial layer structure for the sample is shown in FIG. 1A. (FIG. 1E shows another embodiment of the Epitaxial layer structure, as in FIG. 1A, with the Tunnel junction being shown in detail.) The initial 125 nm $n^+$GaN:Si layer was grown at a thermocouple temperature of 750° C. with a Si beam equivalent pressure (BEP) of $3.8\times10^{-10}$ Torr. This BEP corresponds to a Si donor concentration of $1.6\times10^{19}$ $cm^{-3}$, as calibrated by secondary ion mass spectroscopy (SIMS) on a separate sample. The substrate temperature was then reduced to 745° C. to grow the 167 nm $p^+$GaN:Mg layer in order to enhance Mg incorporation. Mg BEP was kept at $2.3\times10^{-8}$ Torr, corresponding to a Mg acceptor concentration of $2\times10^{19}$ $cm^{-3}$. After growing the $p^+$GaN:Mg, the growth was interrupted to desorb excess Ga prior to active region growth. The active region consists of three 17% InGaN quantum wells (QWs) separated by 13% InGaN quantum barriers (QBs), all grown at a lower temperature of 657° C. to enhance Indium incorporation. After the active region, a 150 nm n GaN layer is grown followed by 600 nm of UID-GaN as the channel for the FET. Finally, a 50 nm degenerately doped n$^{++}$GaN ([Si]=1×10$^{20}$ cm$^{-3}$) layer was grown as the source n-contact layer for the transistor.

Figure 2A:
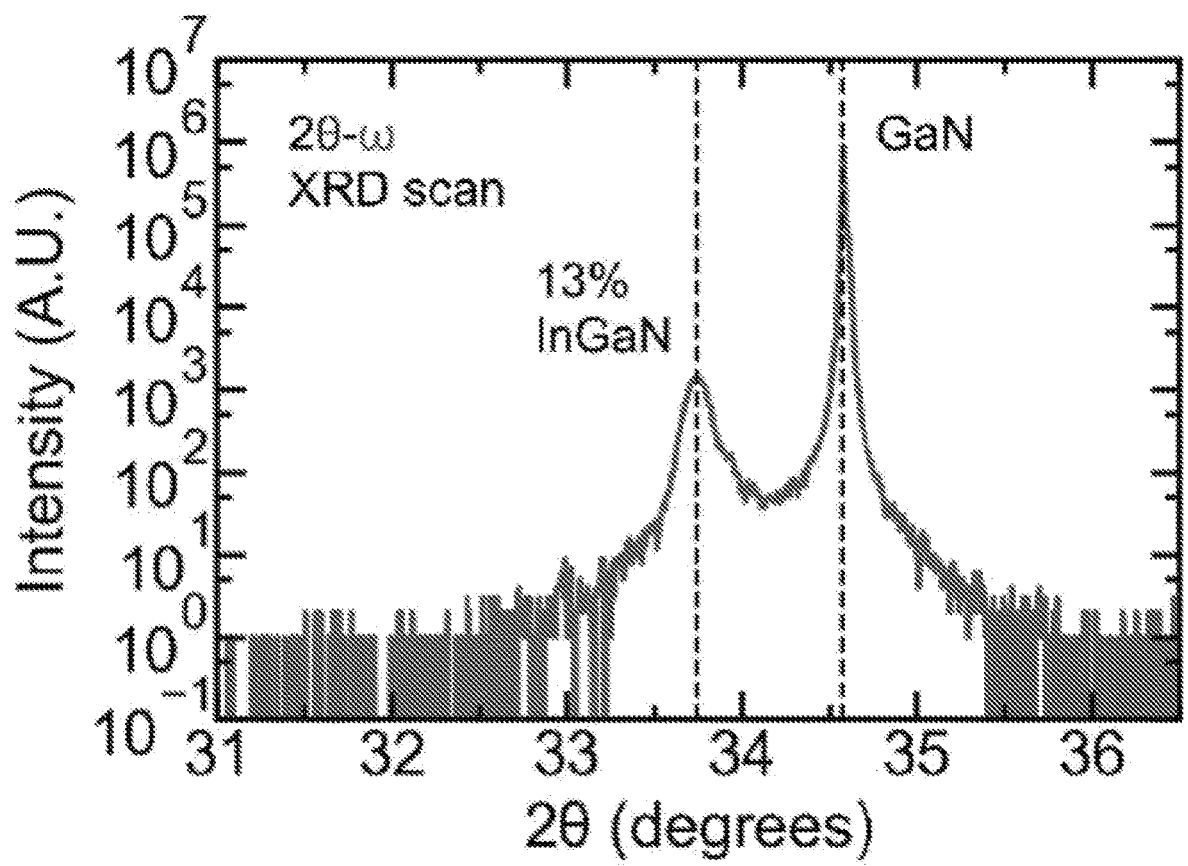
FIG. 2A shows X-ray diffraction spectrum for one embodiment of the LEFET structure of these teachings; showing a GaN substrate peak and an $In_{0.13}Ga_{0.87}N$ peak from the LED cladding regions.
Figure 2B:
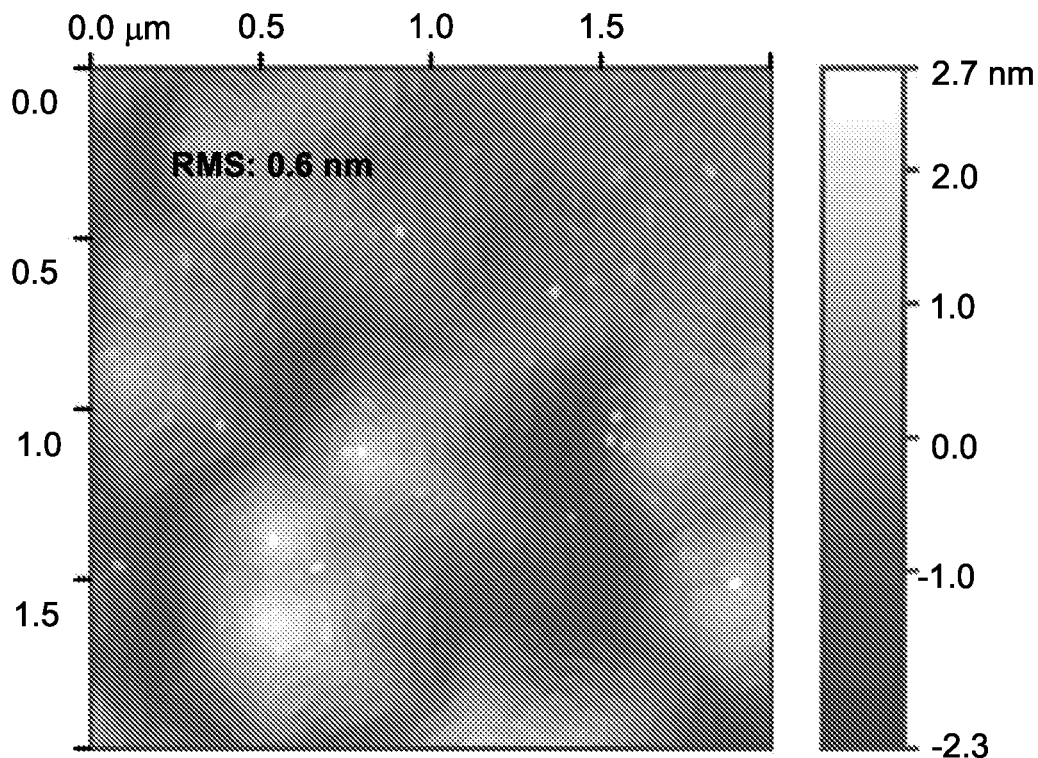
FIG. 2B shows a $2\times2$ $\mu m^2$ AFM scan for the structure in FIG. 1A immediately after MBE growth.

Optical microscope images after the MBE growth showed Ga metal droplets on the surface, confirming the metal rich growth condition. After removing the droplets with HCl, structural characterization was then performed through x-ray diffraction (XRD) and atomic force microscopy (AFM), with the results shown in FIGS. 2A and 2B, respectively. The XRD shows that the InGaN cladding composition in the LED is 13%, and the AFM shows a smooth surface (with root-mean-square roughness~0.6 nm). After performing structural characterization, the sample was processed into devices consisting of various numbers of vertical n-FET nanowires or fins of varying dimensions on top of 55×55 p.m$^2$ LED mesas, in a similar manner to our other GaN and Ga2O3 vertical FETs[26-28]. A schematic of a processed nanowire LEFET is shown in FIG. 1B. First, 55×55 p.m$^2$ LED areas were isolated through inductively-coupled plasma reactive ion etching (ICP-RIE) down to the n$^+$GaN nucleation layer. Next, nanowires and fins were defined on the mesa surface through electron beam lithography (EBL). The etch process for nanowire/fin definition consisted of first an ICP etch (using Cr/Pt as an etch mask as well as top source contact) followed by a wet etch in AZ400K to make the sidewalls vertical for efficient lateral gating (see FIG. 1C). The fins were defined with long edge along the m-plane direction in order to allow for adequate wet etching. Then, SiO2 was deposited by atomic layer deposition (ALD) as a gate dielectric for the nanowire/fin FETs. Next, Cr was sputtered as the sidewall gate metal, followed by e-beam evaporation of large Cr/Au/Ni pads for electrically contacting the gate. The undesired sputtered Cr above the source contact of the fins and wires was etched away after a planarization process, after which SiO2 was blanket deposited by plasma-enhanced chemical vapor deposition (PECVD) to isolate the rest of the sidewall gate metal. This SiO2 was then planarized to again expose the Cr/Pt wire/fin source contact, after which thick source pads (Ti/Al/Pt) for probing were deposited. Gate isolation for the FET wires/fins between different devices (which still had their gates shorted together by the sputtered Cr at this point) and contact holes for the thick gate pads were realized together with an SiO2 etch followed by a Cr etch. Finally, a Ti/Al/Pt back contact was deposited with a window left free of metal for collecting light from the back side.

Figure 3A:
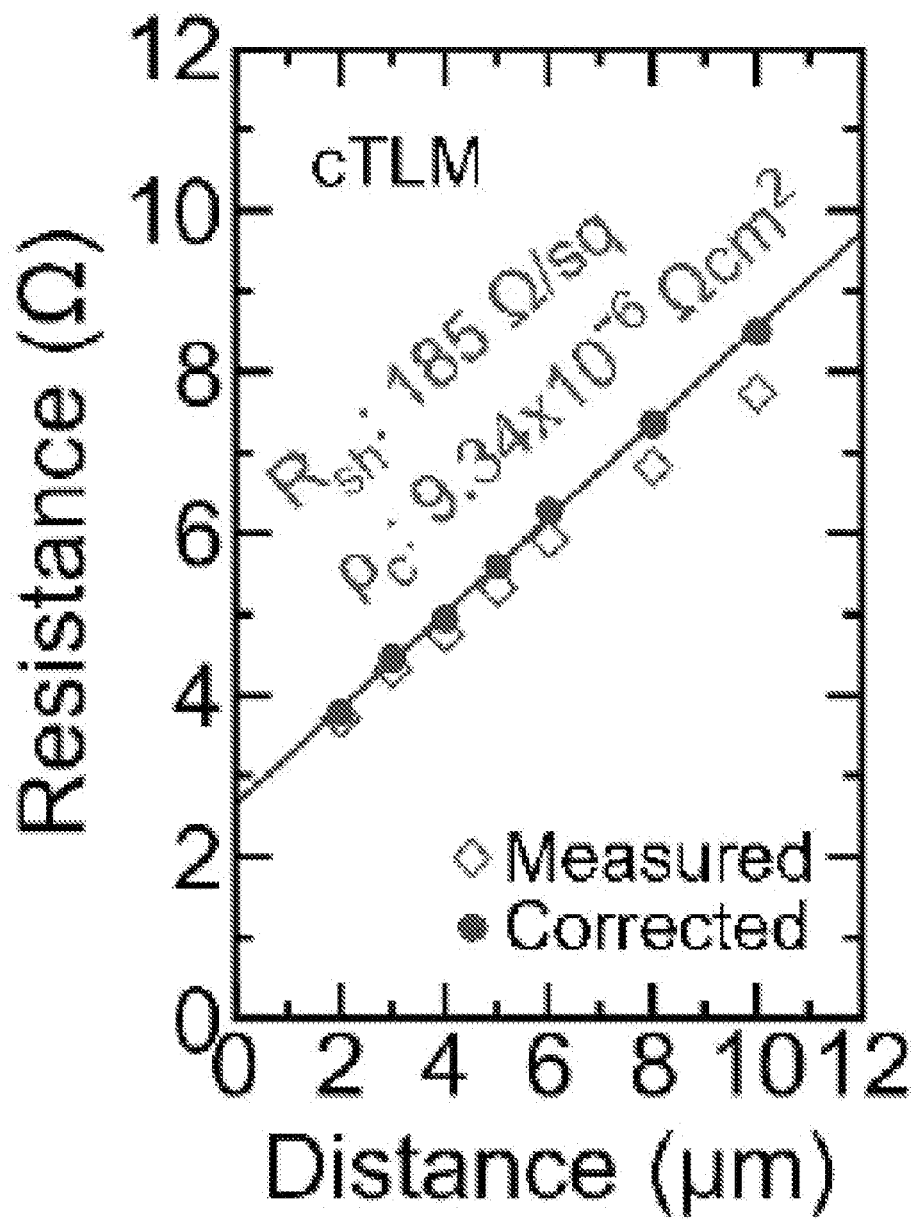
FIG. 3A shows Circular TLM data for the source contact of one embodiment of the LEFET structure of these teachings.
Figure 3B:
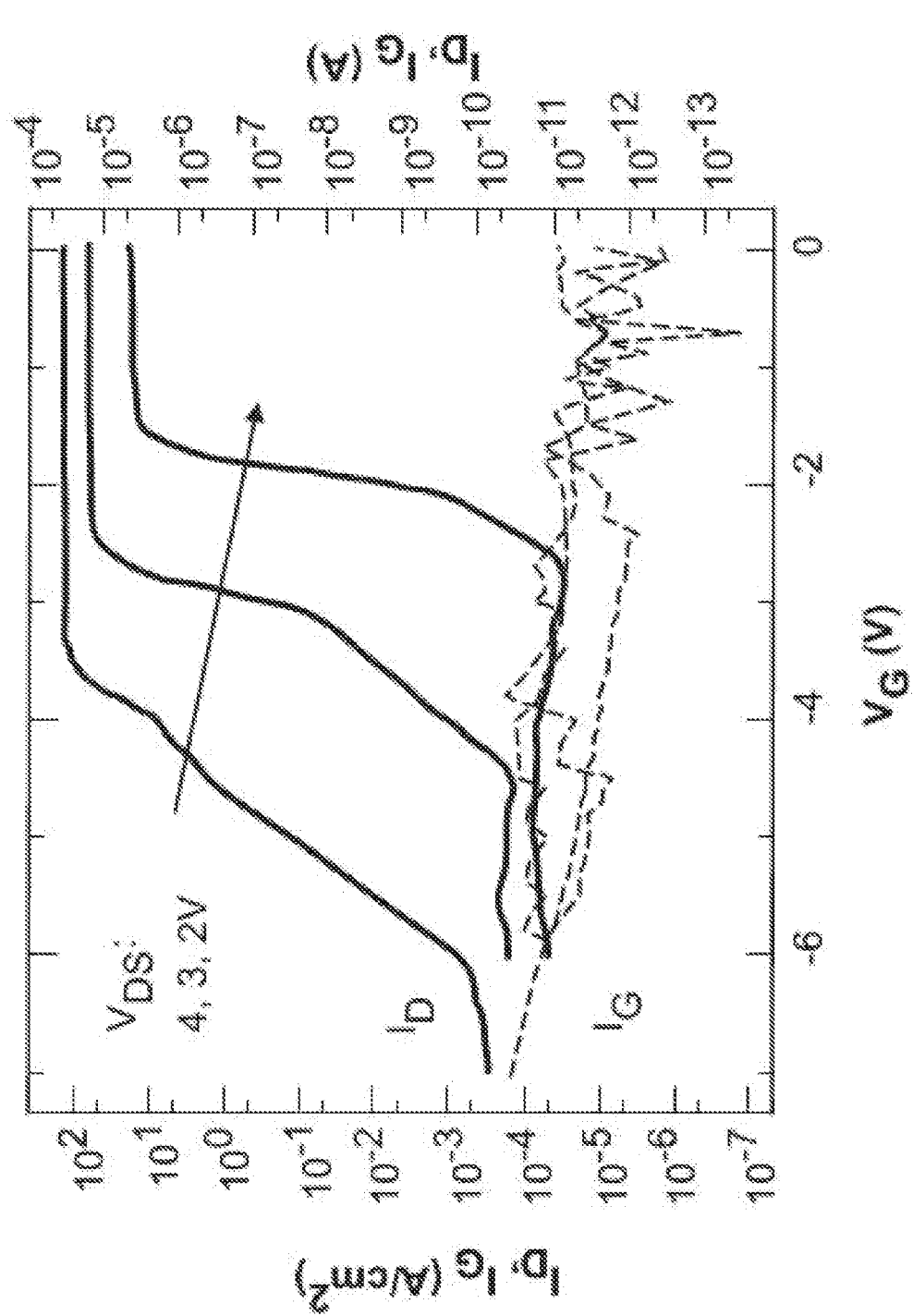
FIG. 3B shows IDVG measurement for one embodiment of the LEFET structure of these teachings having a single-fin device with fin dimensions of 500 nm×50 μm and LED dimensions of 55×55 μm²; [Current density is calculated using the area of the fin.
Figure 3C:
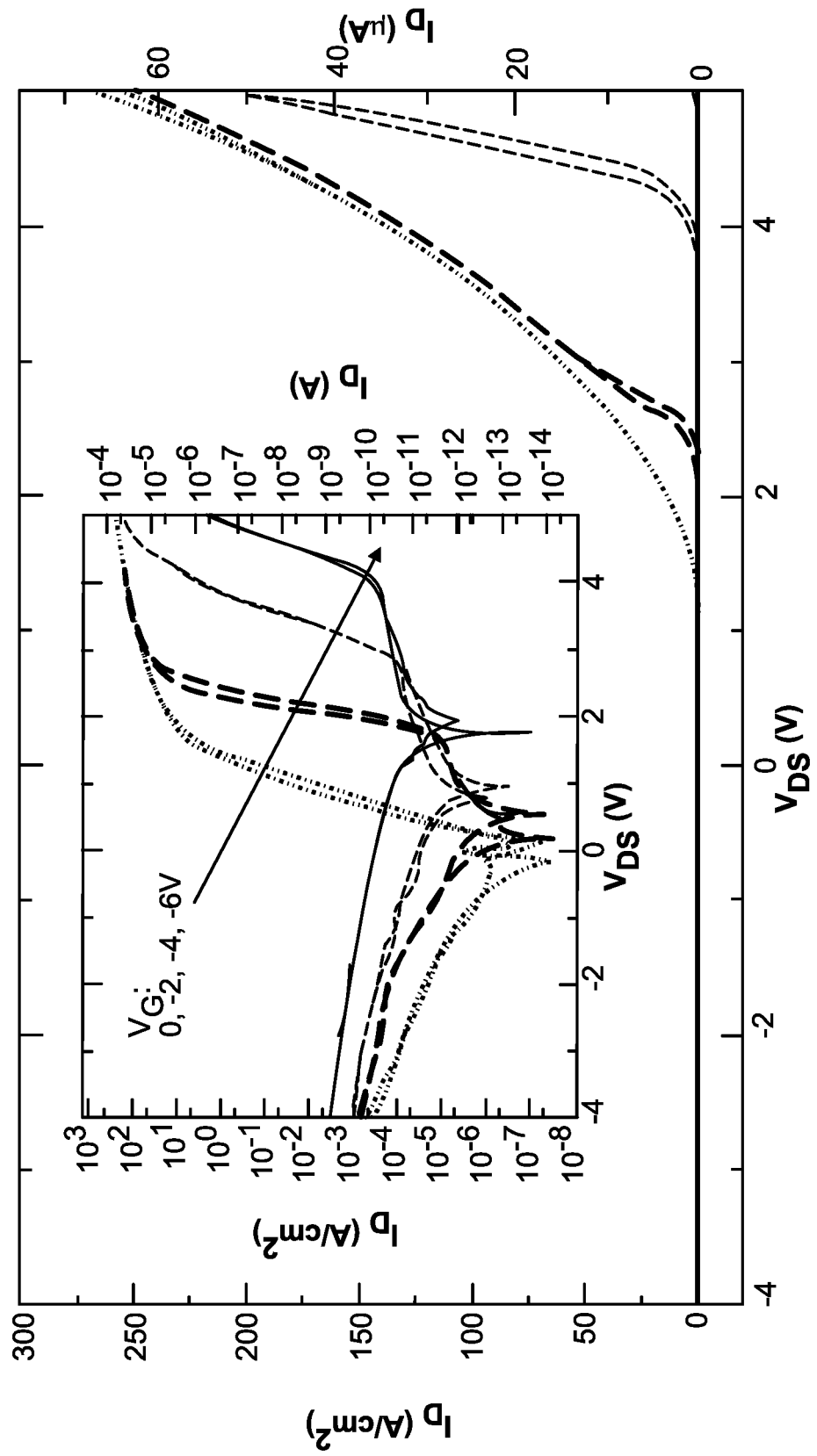
FIG. 3C shows Linear IDVD characteristic (with log-scale in inset)
Figure 3D:
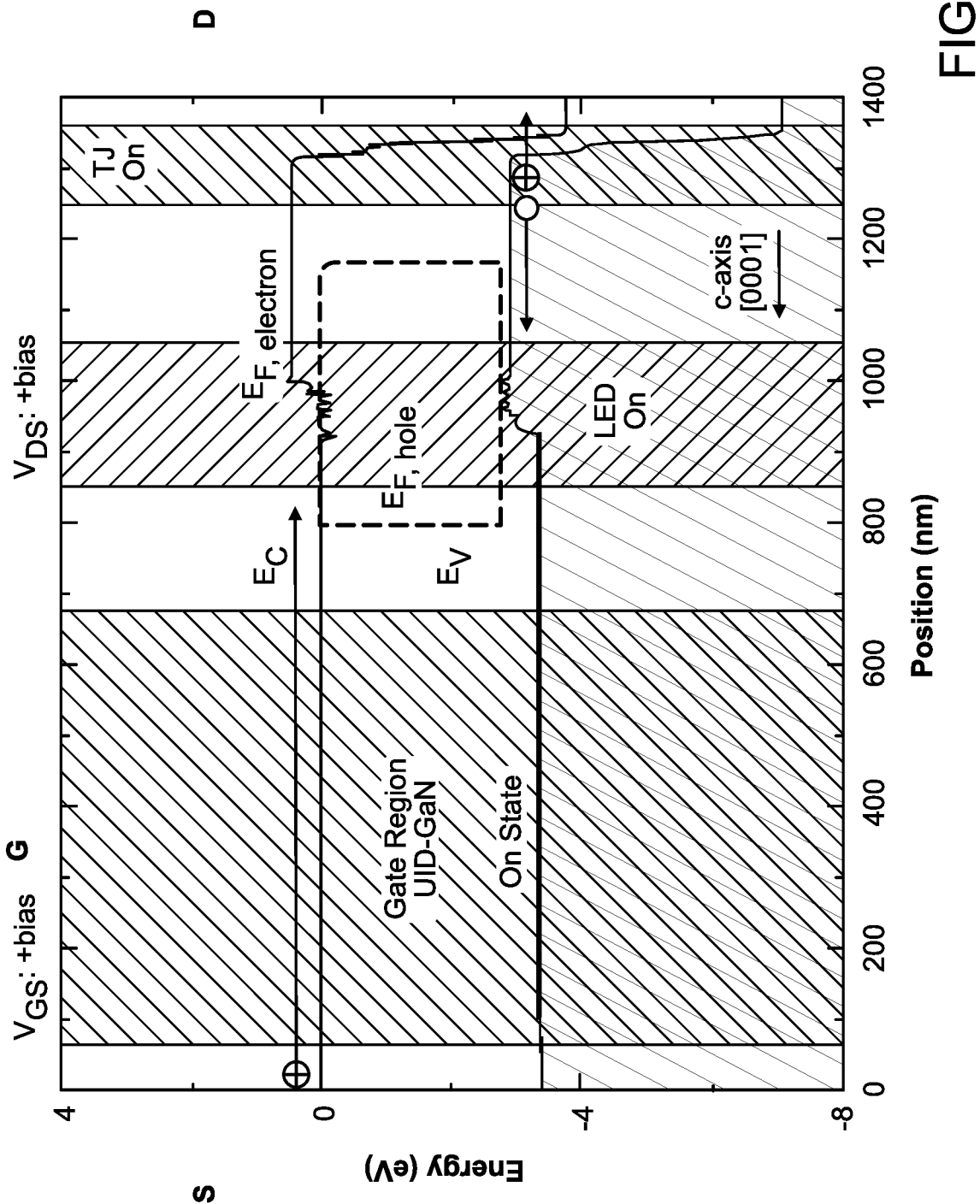
FIGS. 3D and 3E show a Qualitative depiction of band diagrams for one embodiment of the LEFET structure of these teachings with device in the on and off states, respectively.
Figure 3E:
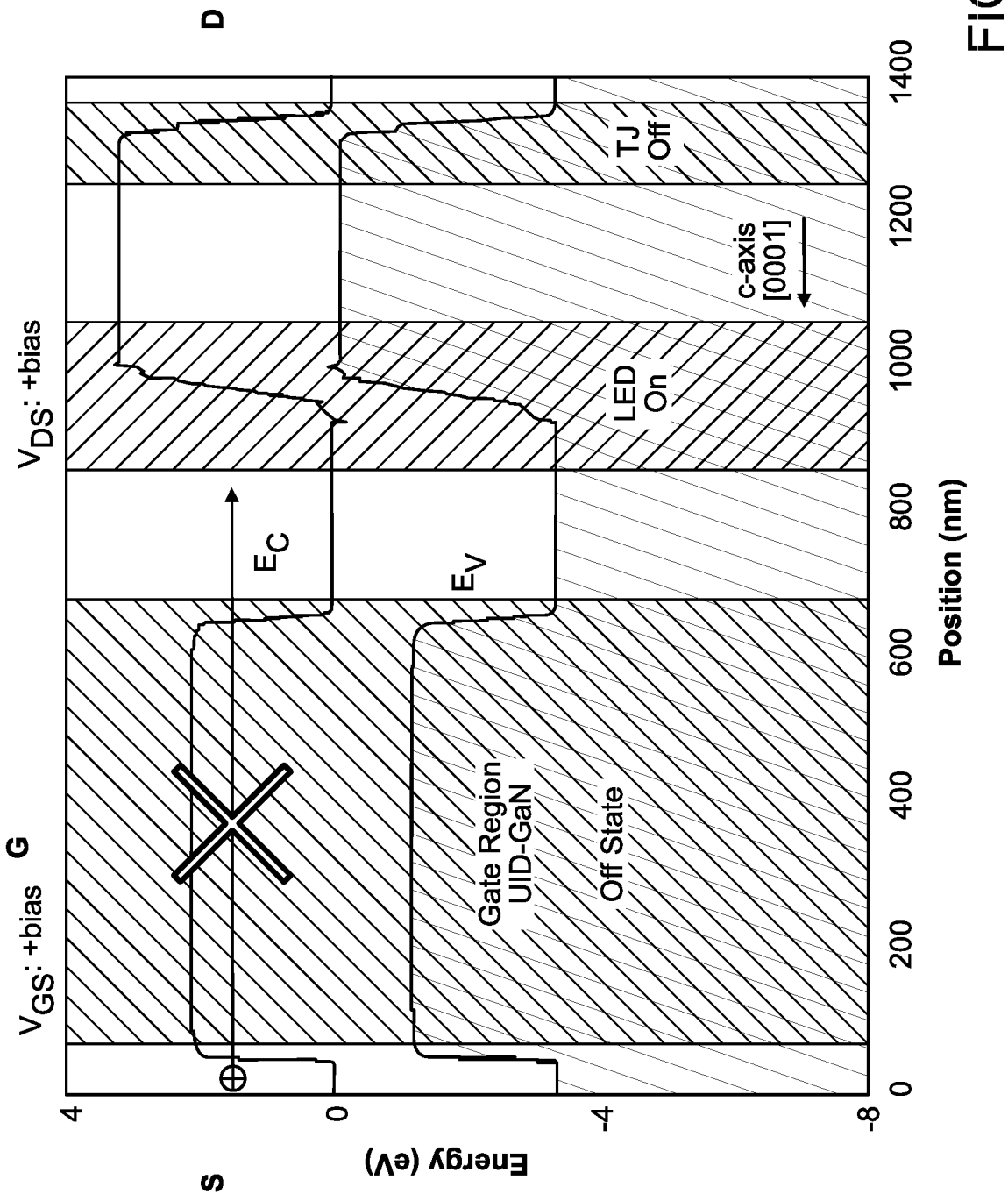

After device processing, electrical and optical measurements were performed, with results for a 500 nm×50 μm single-fin depletion-mode device shown in FIGS. 3A-3D and 4A-4D, respectively. Compared with the multi-fin/wire devices, the single fin/wire devices showed lower gate leakage current and higher on/off ratios due to the reduced gate area. Circular transfer length method (cTLM) measurements shown in FIG. 3A reveal low contact and sheet resistances: 9.34×10$^{-6}$ Wcm$^2$ for the top source contact, and 185 W/sq for the n$^{++}$GaN contact layer underneath, resulting in negligible voltage drops across these regions. ID-VG and ID-VD measurements on the 500 nm×50 μm single-fin device are shown in FIGS. 3B and 3C, respectively, with current density values shown on the plots normalized to the area of the finFET (current density is calculated using the area of the fin). From the ID-VG in FIG. 3B, an on/off ratio of ~5 orders is observed up to VDS=4 V, with gate leakage current low in all cases (below ~100 pA). The on current increases with increasing VDS as expected due to the turn-on of the LED pn diode. The ID-VD measurements in FIG. 3C show that between VG=0V and VG=−6V, a 2 order gate modulation of the on current is achieved at VDS=+5V. FIGS. 3D and E depict the energy band diagrams of the LEFET device in the on and off states, respectively, when biased in a manner applicable for Li-Fi purposes: modulating VG with fixed forward bias VDS. In ideal operation, electrons are injected into the LED portion of the device from the transistor source only when VG is switched to a sufficiently high positive voltage.

Figure 4A:
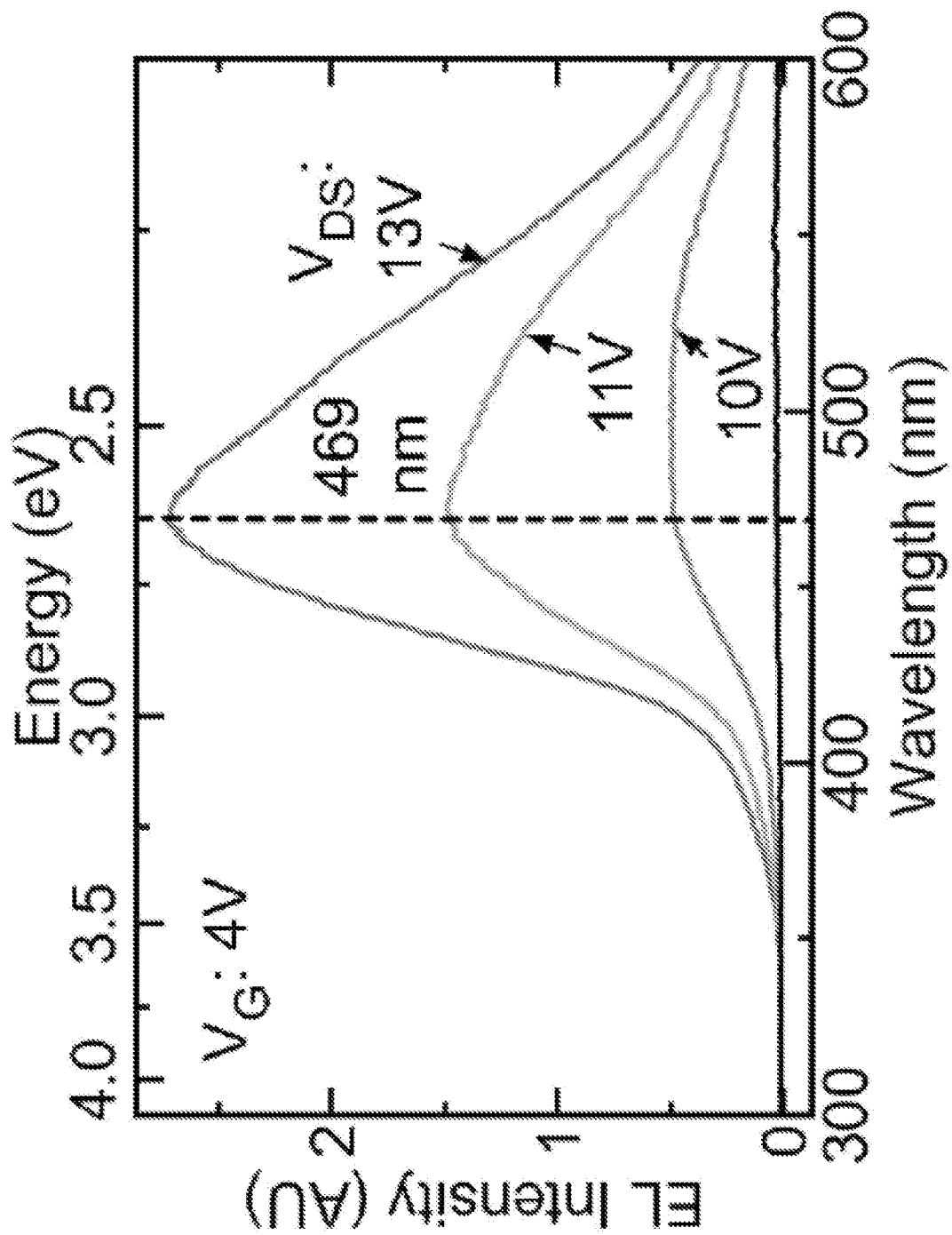
FIGS. 4A-4D show linear and log scale plots, respectively, of electroluminescence (EL) intensity versus wavelength for a single-fin device, with VG fixed at +4V; [The EL intensity rises as expected with increasing vDs as the level of forward bias across the diode is increased; and, FIGS. 5A and 5B show Switching measurements performed on the 500 nm×50 μm single fin device with a 50% duty cycle square wave applied to the gate at a frequency of 10 kHz and 30 kHz, respectively.
Figure 4B:
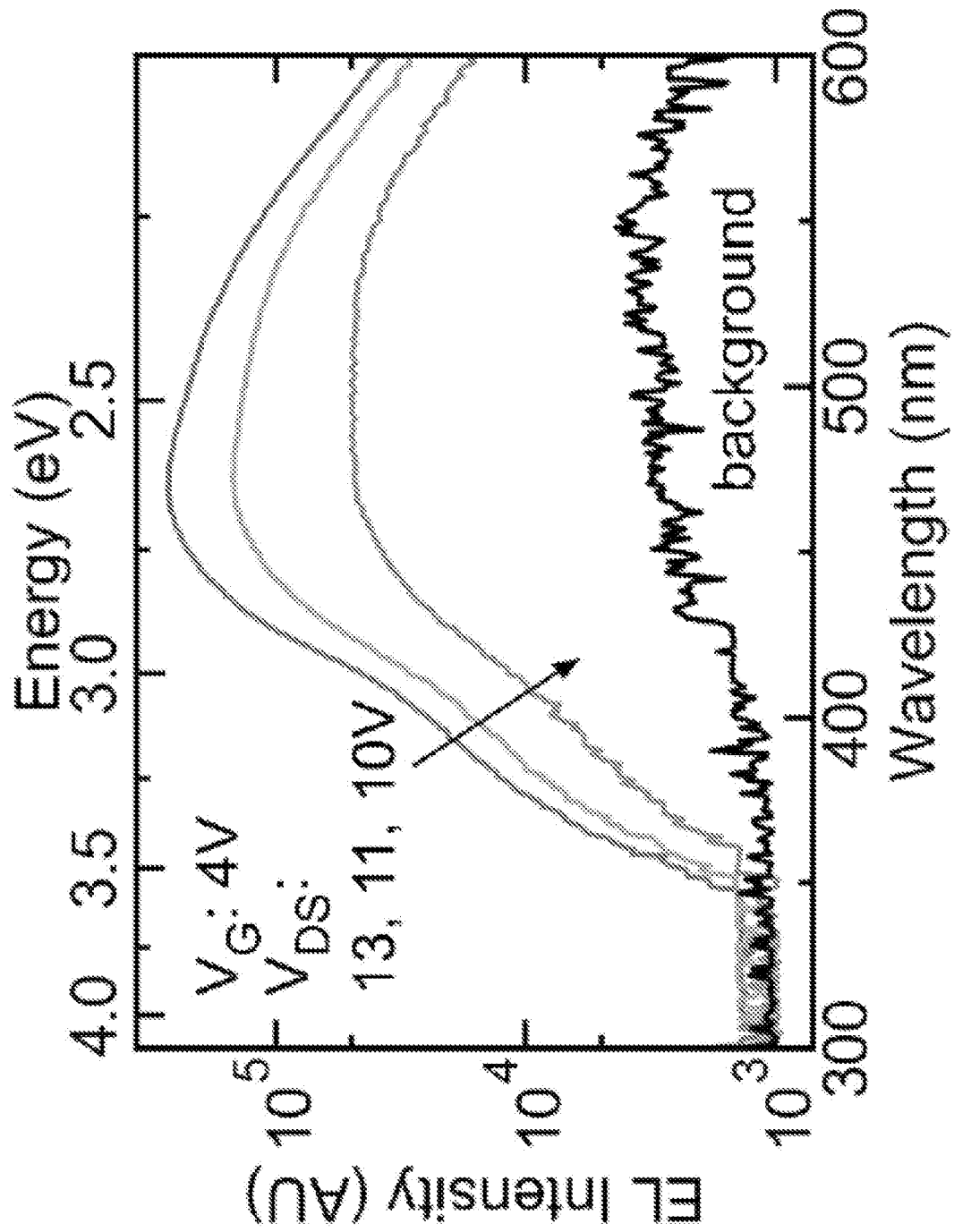

The measured electroluminescence (EL) spectra are shown in FIG. 4A-4D, demonstrating the optical modulation enabled by the FinFET. FIGS. 4A and B show the effect of the drain voltage on the emission spectra in linear and log scales for the 500 nm×50 μm single fin device at a fixed VG=4V for VDS between 10V and 13V. With larger VDS, more light is emitted from the device due to a larger forward bias appearing across the LED portion of the device. The VDS used here is higher than in the electrical measurements due to the limited sensitivity of the optical detection setup used for this work. The emission peak occurs at 469 nm, consistent with a 17% average Indium composition in the QWs.

Figure 4C:
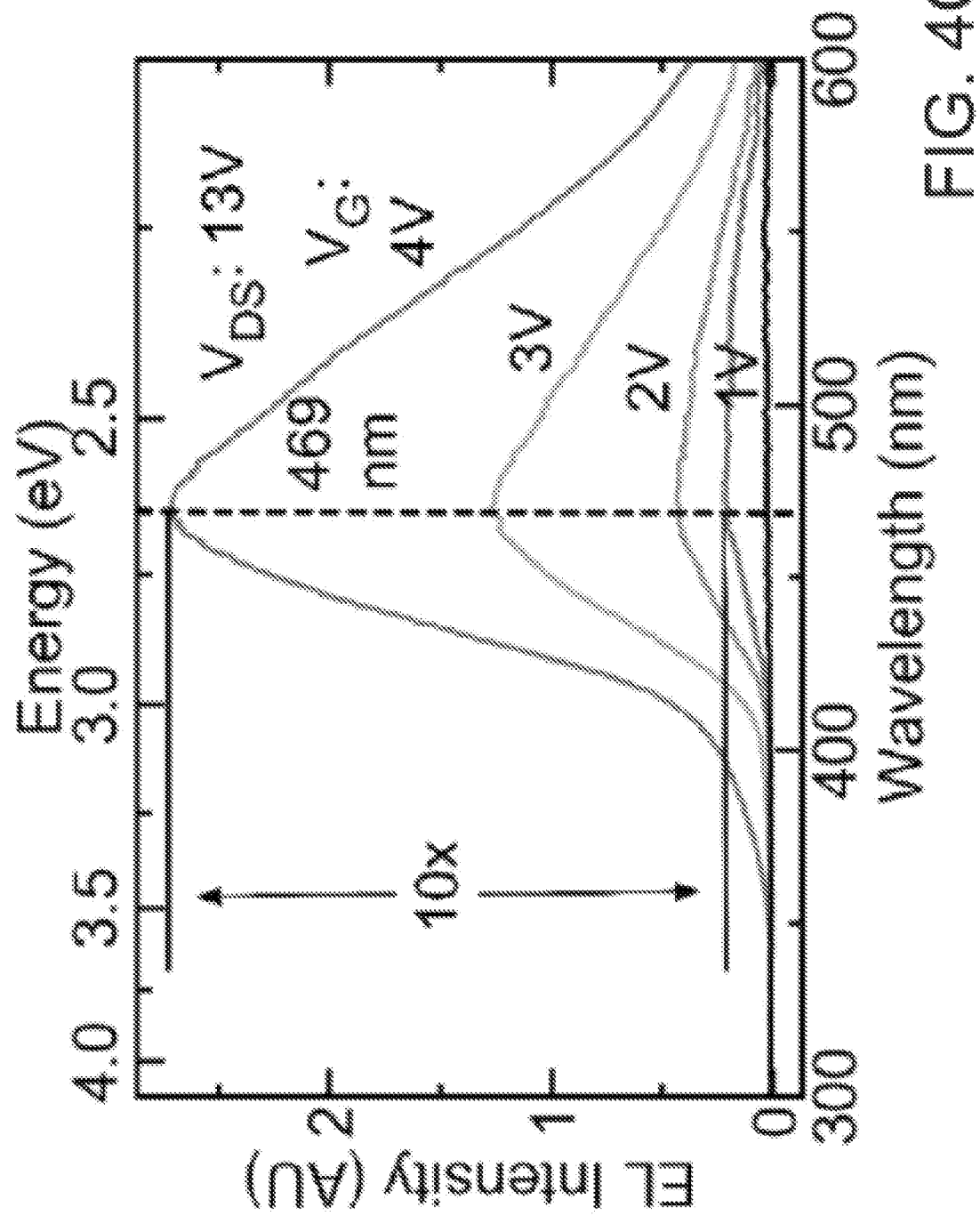
Figure 4D:
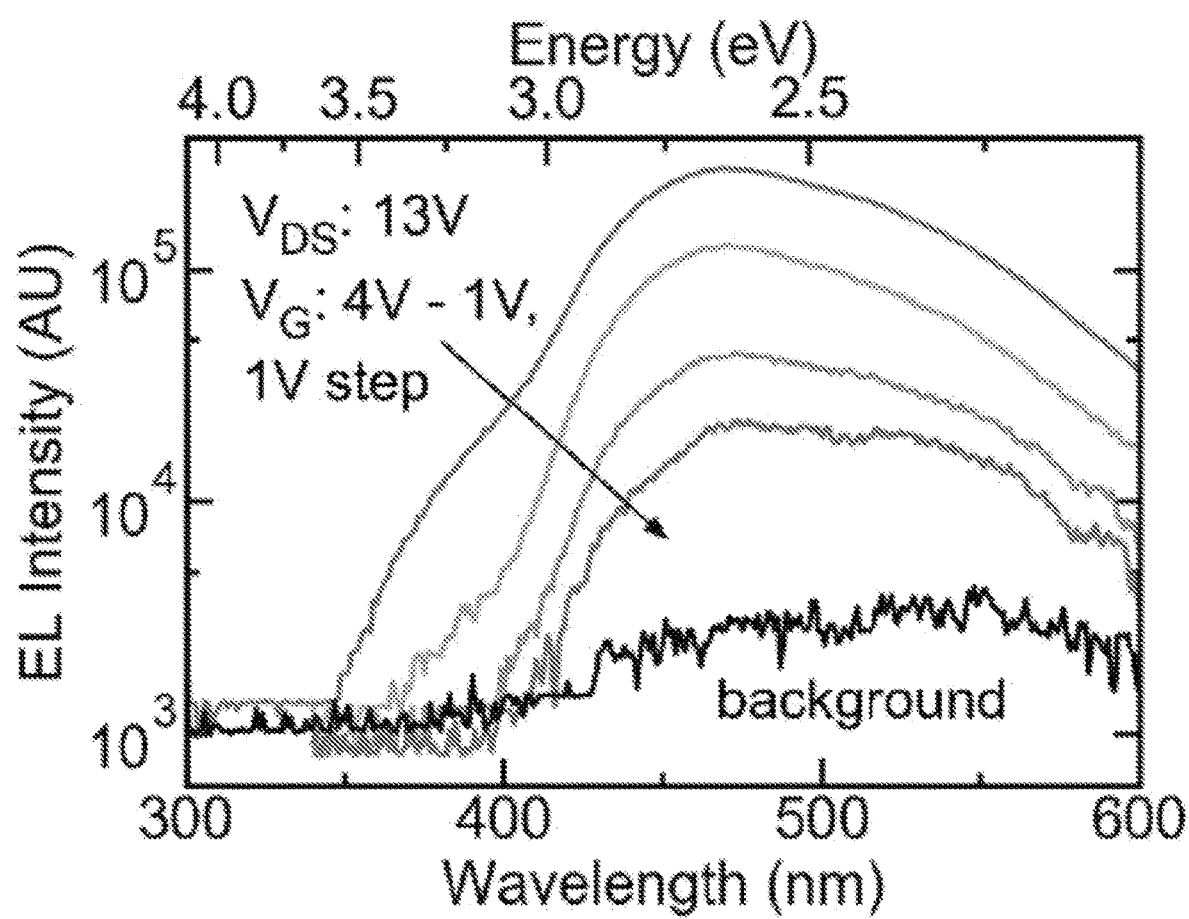

FIGS. 4C and 4D, for the embodiment shown in FIG. 1B, demonstrate the desired modulation of the EL spectra through gating of the GaN FinFET. At a fixed VDS=13V, varying VG from +4V to +1V results in a reduction of EL intensity by a factor of 10. Larger on/off modulation ratios are achieved at lower VDS, though the optical measurement apparatus used is not sensitive enough to measure them. Gate control is limited at these high VDS at which light can be collected by the detector due to high gate-drain field. The brightness of the LED at lower VDS can be drastically increased through use of a heterojunction GaN/InGaN/GaN buried tunnel junction rather than a homojunction, leading to a lower series resistance, as demonstrated in prior work[25]. Such devices show strong EL at current densities of '−1 kA/cm$^2$ corresponding to about 5 V—a VDS voltage/field at which the FET portion of this device shows about 5 orders of on/off ratio. Additionally, increasing the thickness of the n$^+$GaN layer between the fin-FET and planar LED active region will enhance current spreading, increasing optical output power.

Figure 2C:
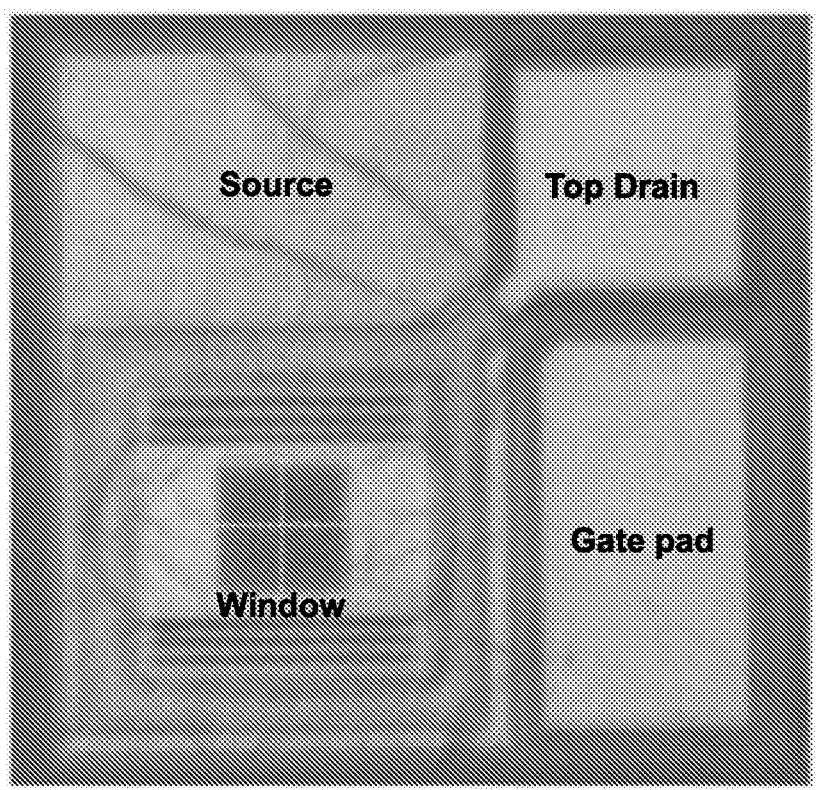
FIG. 2C shows a backlit optical microscope image of the top-view of the embodiment shown in FIG. 1F.
Figure 2D:
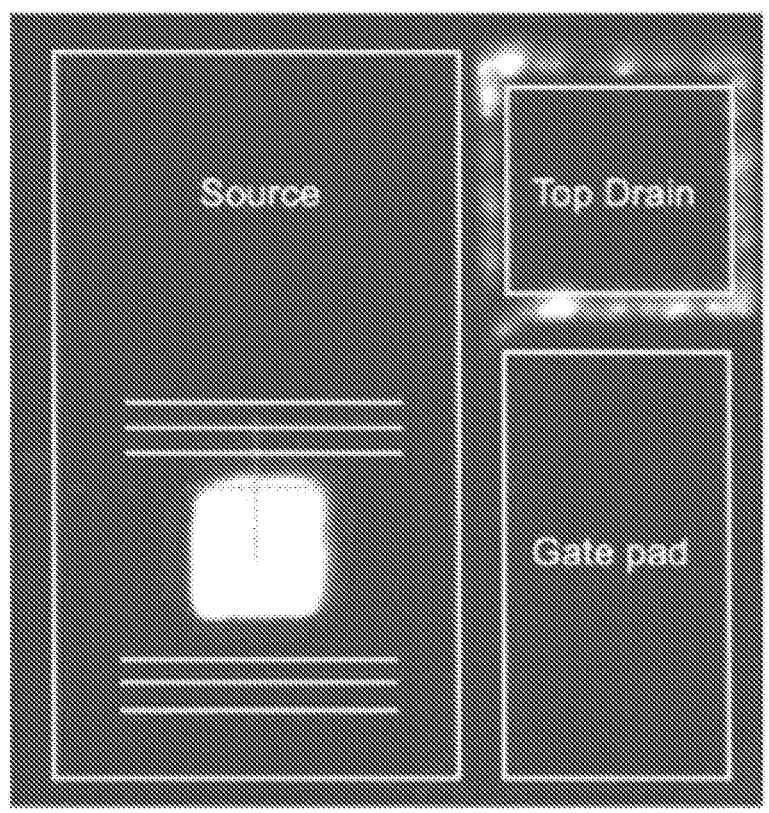
FIG. 2D shows an optical microscope image with no backlighting of the embodiment shown in FIG. 1F.
Figure 2E:
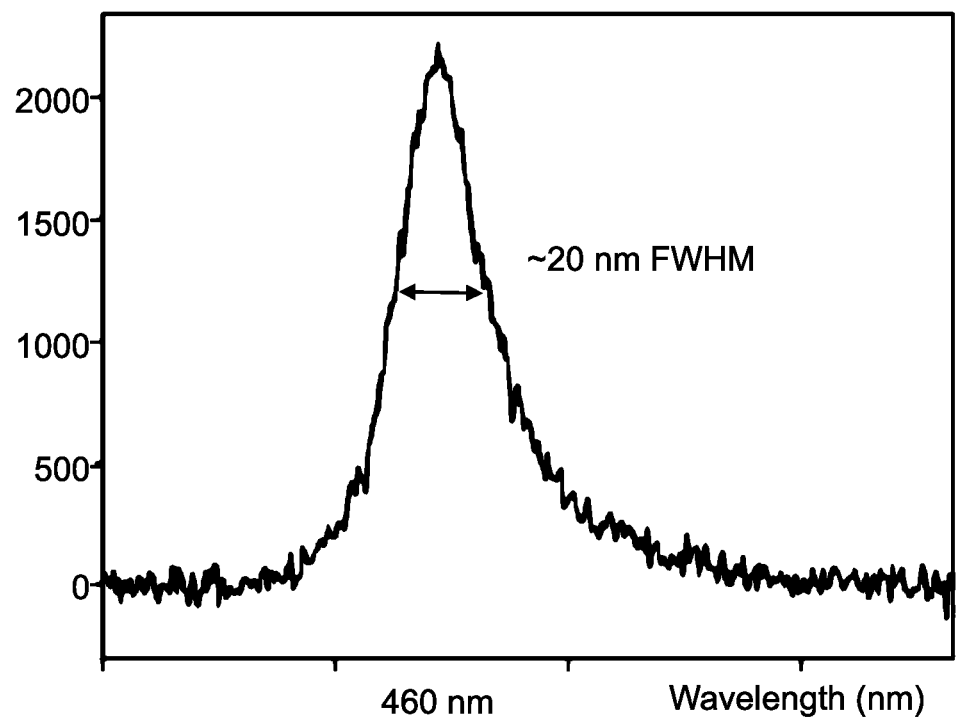
FIG. 2E shows the emission spectrum from the topside of a device from the embodiment shown in FIG. 1F.

For the embodiment shown in FIGS. 1F and 1G, FIG. 2C shows a backlit optical microscope image of the top-view of a fully processed LEFET with six 50 μm by 1 μm fin FETs. FIG. 2D shows an optical microscope image with no backlighting of the same device with the LED in its on state. Uniform, bright emission is achieved from the topside window 185. FIG. 2E shows the emission spectrum corresponding to V$_{D2D}$~6V and I$_{D2D}$~100 mA collected from the topside of the device in FIG. 2C. The peak emission is at ~460 nm with FWHM of ~20 nm. The emission can be tuned between 400 nm and 600 nm by altering the indium composition of the quantum wells.

Figure 5A:
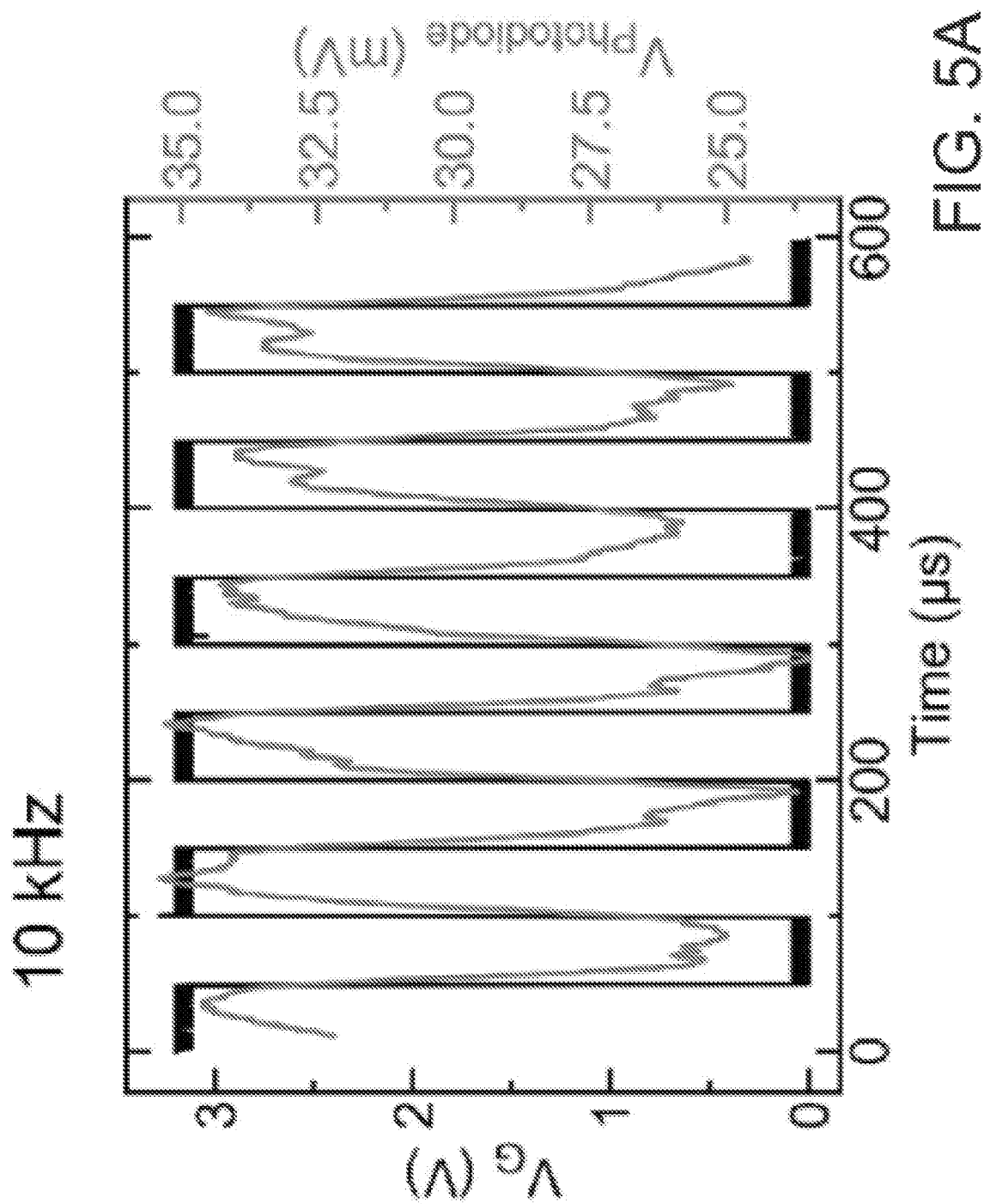
Figure 5B:
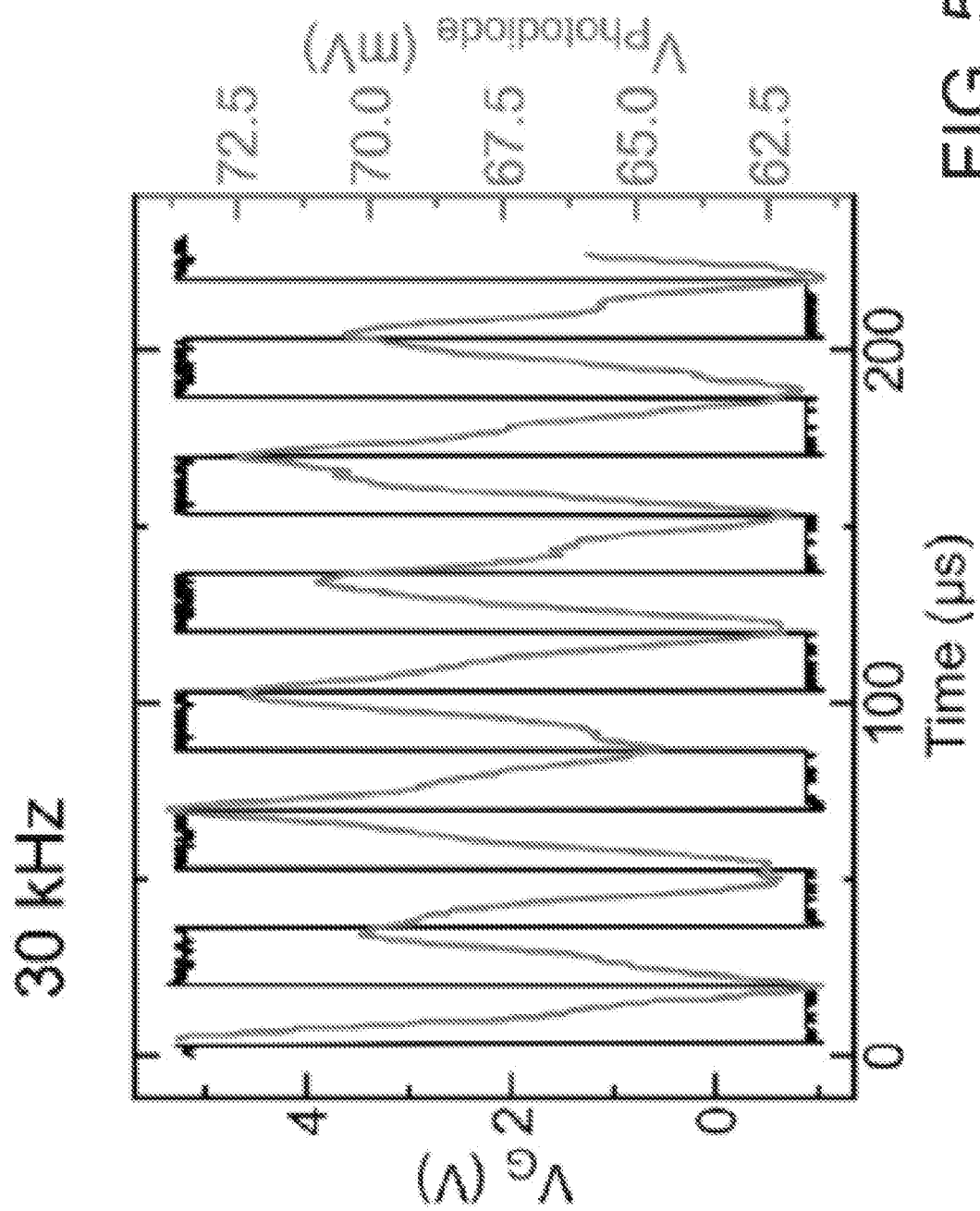

For visible light communications, switching speed is an important parameter that dictates data transmission rates. The optical switching speed of the device was measured by switching VG with VDS fixed at 10 V, and tracking the output signal from a photodiode placed directly underneath the device using an oscilloscope. A square voltage pulse with a duty cycle of 50% was used as the input signal on the gate, with the frequency varied between 1 kHz and 100 kHz. The input electrical signal (square wave-black) and output photodiode voltage signal (thinner) are shown in FIGS. 5A-5B for frequencies of 10 and 30 kHz. (For the 10 kHz measurement, V$_G$ is switched from 0 to +3V, while for the 30 kHz measurement, V$_G$ is switched from −1V to +4V.) Limitations of the optical collection setup result in low signal to noise ratio, so a Savitzky-Golay filter was used after collecting the data to reduce the noise in the photodiode output signal. The device maintains an optical switching response up to 30 kHz, beyond which the optical response flattens out. Though this modulation proves the feasibility of the LEFET for direct voltage modulation of light, the design of the device geometry can be optimized for the much higher speeds necessary. Control of the UID GaN thickness and the sidewall gate dielectric and the resulting gate capacitance can enhance the gate-voltage modulation speed of the optical output power.

It should be noted that the device geometry need not change for different wavelengths—the same design should work fine for extracting light at any wavelength in the IR, visible, or UV range. For different wavelength emitters, the material compositions in the structure would have to change, but the fabrication method would stay very similar. Visible wavelengths between ~400 nm and 600 nm can be achieved by simply changing the indium composition in the quantum wells, while leaving the processing substantially the same. One exception is that for some materials (i.e., deep UV emitter materials), conducting substrates are not available. Because of that, the drain contact, which in the above design is on the backside of the substrate, would have to be on the etched n-GaN epi-surface (where the gate pad is, but not separated from the n+GaN by oxide). This would simply require doing the drain metal deposition earlier in the process. For deep UV emitters, the GaN would be replaced by AlGaN, but the metallizations and etch chemistry are substantially identical for AlGaN, InGaN, and GaN.

A technique for achieving monolithic integration of n-FETs and LEDs, using vertical fin- and nanowire-FETs and bottom tunnel junction planar LEDs has been demonstrated in these teachings. This platform allows for strong gate control (about 5 orders of magnitude on/off for ID) without limiting the on-wafer LED active area and does not require regrowth. Optical switching behavior up to 30 kHz was demonstrated in the initial embodiments, with improvement possible through use of InGaN heterojunction TJs. The LEFET device geometry can be easily modified for light extraction from the surface without sacrificing significant wafer area by patterning the top source contact. Such devices are promising for use in Li-Fi communications and in micro-LED displays, in which gate voltage controllability along with utility of space are important parameters.

For the purpose of better describing and defining the present teachings, it is noted that terms of degree (e.g., "substantially," "about," and the like) may be used in the specification and/or in the claims. Such terms of degree are utilized herein to represent the inherent degree of uncertainty that may be attributed to any quantitative comparison, value, measurement, and/or other representation. The terms of degree may also be utilized herein to represent the degree by which a quantitative representation may vary (e.g., ±10%) from a stated reference without resulting in a change in the basic function of the subject matter at issue.

International application WO 2020/096838, published on May 14, 2020, is incorporated by reference herein in its entirety and for all purposes.

Although the teachings have been described with respect to various embodiments, it should be realized these teachings are also capable of a wide variety of further and other embodiments within the spirit and scope of the appended claims.

What is claimed is:

1. A light emitting FET structure comprising:
   a substrate having a first surface opposite a second surface;
   one or more layers of n-doped III-nitride material disposed on the first surface of the substrate
   a sub-structure comprising:
      a tunnel junction disposed on at least one portion of the one or more layers of n-doped III-nitride material;
      a p-type III-nitride layer formed directly on the tunnel junction;
      an active layer comprising one or more III-nitride quantum wells disposed on the p-type III-nitride layer; and
      one or more other layers of n-doped III-nitride material disposed on the active layer;
   a layer of unintentionally doped III-nitride material disposed on the one or more other layers of n-doped III-nitride material of the sub-structure; the layer of unintentionally doped III-nitride material being patterned into one or more nanopillars or nanowires;
   a further layer of n-doped III-nitride material disposed on the one or more nanopillars or nanowires;
   an insulating layer disposed on at least one of (a) surfaces of the nanopillars or nanowires extending from below the further layer of n-doped III-nitride material to said one or more other layers of n-doped III-nitride material not covered by the unintentionally doped III-nitride material, also on a surface of the one or more other layers of n-doped III-nitride material not covered by the unintentionally doped III-nitride material or (b) disposed along the sub-structure from the one or more other layers of n-doped III-nitride material to said at least one portion of the one or more layers of n-doped III-nitride material;
   a metal layer disposed over the insulating layer on at least one of (i) along the one or more nanopillars or nanowires, (ii) on a portion of a surface of the one or more other layers of n-doped III-nitride material, the layer of unintentionally doped III-nitride material being disposed on said surface, the portion being the portion on which the layer of unintentionally doped III-nitride material is not disposed, or (iii) disposed along the insulating layer that is disposed along the sub-structure from the one or more other layers of n-doped III-nitride material to said at least one portion of the one or more layers of n-doped III-nitride material;
   a first ohmic contact layer disposed on a portion of said metal layer; and
   a second ohmic contact layer disposed on said further layer of n-doped III-nitride material.

2. The light emitting FET structure of claim 1 wherein the active layer is a light emitting layer.

3. The light emitting FET structure of claim 1 wherein the substrate is conducting; the light emitting FET structure further comprising a third ohmic contact disposed on the second surface of the substrate.

4. The light emitting FET structure of claim 1 comprising another portion of the one or more layers of n-doped III-nitride material, the tunnel junction not being disposed on said another portion of the one or more layers of n-doped III-nitride material;
   the insulating layer being also disposed on said another portion of the one or more layers of n-doped III-nitride material;
   the metal layer being disposed along the insulating layer that is disposed along the sub-structure from the one or more other layers of n-doped III-nitride material to said at least one portion of the one or more layers of n-doped III-nitride material;

the metal layer also being disposed on the insulating layer that is disposed on at least part of said another portion of the one or more layers of n-doped III-nitride material.

5. The light emitting FET structure of claim 4 wherein in the substrate is a metal (III)-polar III-nitride substrate.

6. The light emitting FET structure of claim 4 wherein the first ohmic contact layer is disposed on the portion of said metal layer that is disposed on a portion of the insulating layer, the portion of the insulating layer being disposed on said another portion of the one or more layers of n-doped III-nitride material.

7. The light emitting FET structure of claim 4 further comprising another ohmic contact disposed on an outer area of the one or more other layers of n-doped III-nitride material not covered by the unintentionally doped III-nitride material; the insulating layer being also disposed over said another ohmic contact.

8. The light emitting FET structure of claim 7 wherein the one or more nanopillars or nanowires comprise at least two one or more nanopillars or nanowires; the two or more nanopillars or nanowires comprising two groups of nanopillars or nanowires; each one of the groups of nanopillars or nanowires surrounding a portion of a perimeter of an opening.

9. The light emitting FET structure of claim 7 further comprising a third ohmic contact disposed on the second surface of the substrate.

10. The light emitting FET structure of claim 9 wherein the third ohmic contact comprises another opening, an area of said another opening substantially comprising an area of said opening.

11. A method for forming an LE FET, the method comprising:

epitaxially depositing one or more layers of n-doped III-nitride material on a first surface of a substrate;
epitaxially forming a substructure on the one or more layers of the n-doped III-nitride material; the substructure comprising:
  a tunnel junction disposed on at least a first portion of the one or more layers of n-doped III-nitride material;
  a p-type III-nitride layer formed directly on the tunnel junction;
  an active layer comprising one or more III-nitride quantum wells disposed on the p-type III-nitride layer; and
  one or more other layers of n-doped III-nitride material disposed on the active layer;
epitaxially depositing a layer of unintentionally doped III-nitride material on the substructure;
epitaxially depositing a further layer of n-doped III-nitride material on the layer of unintentionally doped III-nitride material;
patterning the further layer of n-doped III-nitride material and the layer of unintentionally doped III-nitride material into one or more nano-pillars or nano-wires;
depositing, after patterning, an ohmic contact on the further layer of n-doped III-nitride material;

patterning the substructure into a mesa on at least one second portion of the one or more layers of the n-doped III-nitride material;
depositing an insulating layer on surfaces of the one or more nano-pillars or nano-wires extending from below the further layer of n-doped III-nitride material to said one or more other layers of n-doped III-nitride material not covered by the unintentionally doped III-nitride material, also on a surface of the one or more other layers of n-doped III-nitride material not covered by the unintentionally doped III-nitride material, along the substructure from the one or more other layers of n-doped III-nitride material to said at least one second portion of the one or more layers of n-doped III-nitride material, and another portion of the one or more layers of n-doped III-nitride material on which the mesa is not disposed;
depositing a metal layer along the insulating layer that is disposed along the substructure from the one or more other layers of n-doped III-nitride material to said at least one second portion of the one or more layers of n-doped III-nitride material and on the insulating layer that is disposed on said another portion of the one or more layers of n-doped III-nitride material; and
depositing another ohmic contact on the metal layer.

12. The method of claim 11 wherein the substrate is conducting; the method further comprising: depositing a third ohmic contact on a second surface of the substrate; and patterning an aperture on the third ohmic contact in order to facilitate collection of light.

13. The method of claim 11 further comprising: depositing, after depositing said another ohmic contact on the metal layer, another insulating material in order to isolate components.

14. The method of claim 11 further comprising: depositing an ohmic contact pad on the ohmic contact on the further layer of n-doped III-nitride material.

15. The method of claim 11 further comprising depositing, before the depositing of the insulating layer, a further other ohmic contact on an outer area of the one or more other layers of n-doped III-nitride material not covered by the unintentionally doped III-nitride material; the insulating layer being also disposed over said further other ohmic contact.

16. The method of claim 15 wherein the metal layer is also deposited on the insulating layer on surfaces of the one or more nano-pillars or nano-wires extending from below the further layer of n-doped III-nitride material to said one or more other layers of n-doped III-nitride material not covered by the unintentionally doped III-nitride material and on the insulating layer over said further other ohmic contact.

17. The method of claim 16 further comprising: depositing, after depositing said another ohmic contact on the metal layer, another insulating material in order to isolate components.

18. The method of claim 17 further comprising: depositing an ohmic contact pad on the ohmic contact on the further layer of n-doped III-nitride material.

19. The light emitting FET structure of claim 1 wherein the substrate is non-conducting; the light emitting FET structure further comprising a third ohmic contact disposed on the one or more layers of n-doped III-nitride material.

* * * * *